United States Patent [19]

Ferguson

[11] Patent Number: 4,701,645

[45] Date of Patent: Oct. 20, 1987

[54] SWITCHING CIRCUIT WITH LOW CONDUCTED ELECTROMAGNETIC INTERFERENCE CHARACTERISTICS

[75] Inventor: Thomas F. W. Ferguson, New York, N.Y.

[73] Assignee: Cox & Company, Inc., New York, N.Y.

[21] Appl. No.: 694,626

[22] Filed: Jan. 24, 1985

[51] Int. Cl.[4] .................. H03K 17/60; H03K 5/00
[52] U.S. Cl. ................................ 307/570; 307/542; 307/647; 307/632; 307/642
[58] Field of Search ............... 307/252 B, 252 M, 570, 307/571, 575, 252 A, 252 R, 577, 252 UA, 252 N, 253, 254, 252 Q, 252 T, 584, 304

[56] References Cited

U.S. PATENT DOCUMENTS

| | | | |
|---|---|---|---|
| 3,296,518 | 1/1967 | Stumpe | 307/252 N |
| 3,443,188 | 5/1969 | Mortimer | 307/252 B |
| 3,448,294 | 6/1969 | Henderson et al. | 307/252 Q |
| 3,489,927 | 1/1970 | Kelley, Jr. et al. | 307/252 N |
| 3,879,620 | 4/1975 | Akamatsu | 307/252 M |
| 4,402,003 | 8/1983 | Blanchard | 307/304 |
| 4,500,802 | 2/1985 | Janutka | 307/584 |
| 4,551,643 | 11/1985 | Russell et al. | 307/304 |
| 4,631,472 | 12/1986 | McCollum et al. | 307/252 Q |

FOREIGN PATENT DOCUMENTS 0007850 1/1979 Japan .............................. 307/252 M Primary Examiner—Stanley D. Miller
Assistant Examiner—Trong Quang Phan
Attorney, Agent, or Firm—Mark H. Jay

[57] ABSTRACT

A pass network includes a switching element having a non-smooth conduction characteristic in the transition region about zero-crossover of an AC signal to be switched. A bypass network is connected in parallel with the pass network and has a smooth conduction characteristic in that transition region.

7 Claims, 34 Drawing Figures

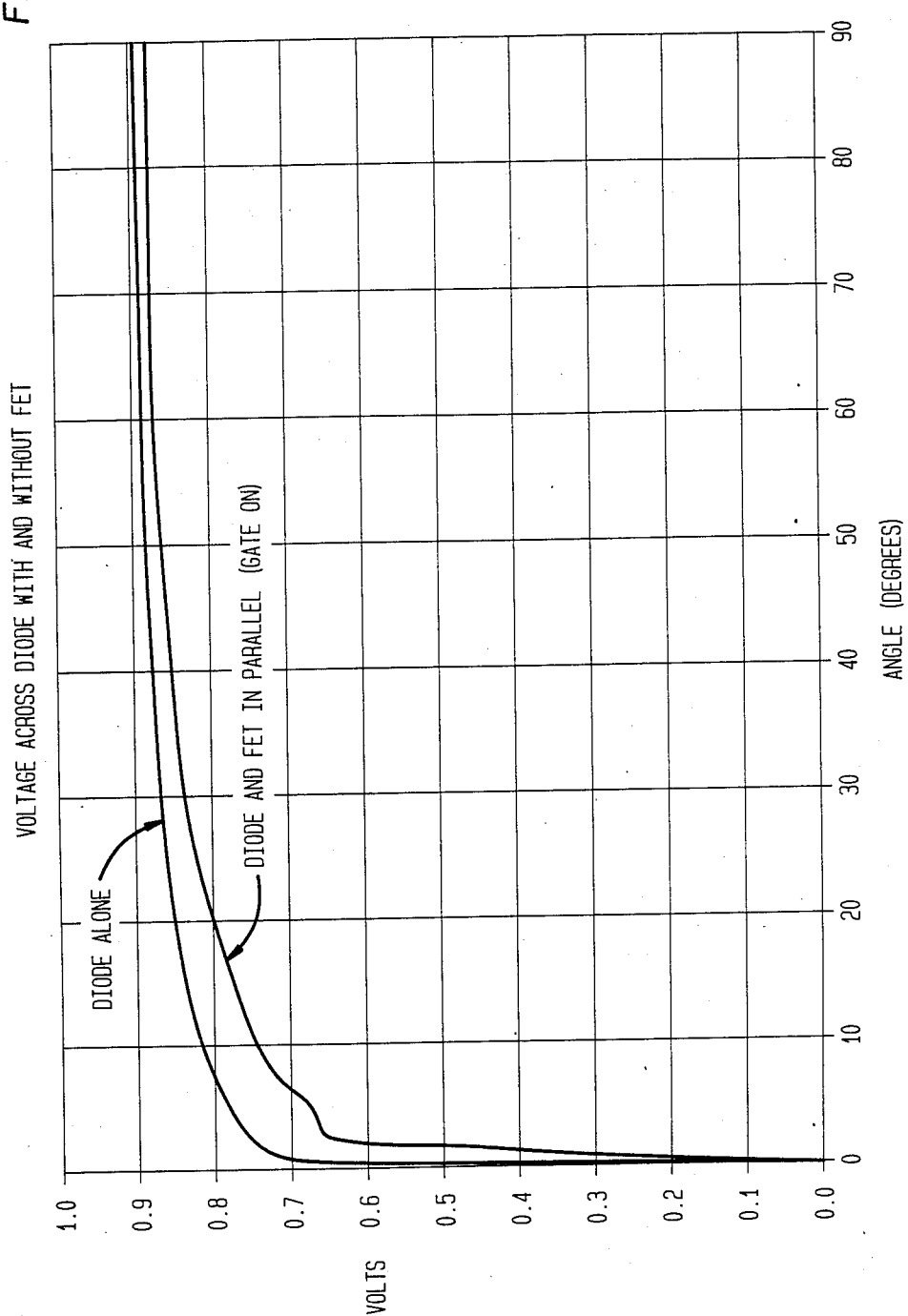

SWITCHING CIRCUIT WITH LOW CONDUCTED ELECTROMAGNETIC INTERFERENCE CHARACTERISTICS

BACKROUND OF THE INVENTION

The invention relates to switching circuits, and more particularly to switching circuits of the zero-crossing type.

When AC signals (and particularly high-power AC signals) are switched on and off, conducted electromagnetic interference arises. There exist applications in which such interference (hereinafter referred to as "conducted EMI") is undesirable, and techniques for minimizing it have therefore been developed.

One such technique is the use of a zero-crossing switching circuit or ZCSC, by itself or together with an appropriate filter network. A ZCSC is a circuit that turns an AC signal on and off only when the signal is at or adjacent zero volts, i.e. in the transition regions about 0°, 180°, 360°, and so on.

If it were feasible to construct such a ZCSC which always switched at exactly zero volts, conducted EMI would be entirely eliminated. However, production of such ZCSC's has not proved feasible. Conduction and cutoff of the switched AC signal always takes place on one side or the other of zero-crossover, even if only by a small angular amount. There is accordingly a residuum of conducted EMI caused by even the best available ZCSC's.

Even relatively small quantities of conducted EMI are objectionable in certain applications. For example, military aircraft can contain large quantities of densely packed electronic apparatus. If each unit emits even a small amount of conducted EMI, the aggregate amount of conducted EMI can make some apparatus nonfunctional.

There have therefore been developed standards (both civilian and military) which establish maximum permissible limits for conducted EMI over frequency ranges of interest. One such military standard is MIL-STD-461A(3) test CE03; this standard is considered stringent.

When ZCSC's are used for high-power AC signals (as, for example, in the case of proportional temperature controllers used to control 3-phase anti-icing or deicing heaters on military aircraft), the resulting conducted EMI exceeds the limits imposed by this MIL-STD. The conducted EMI must therefore be further limited; such limitation is generally accomplished with an LC filter. At high power levels, the appropriate inductors and capacitors are physically large and heavy and are also expensive.

There exist applications, such as on military aircraft, where it has previously proved impossible to meet this MIL-STD while meeting restraints on package size and weight. In such applications, conducted EMI performance must be traded off against size and weight.

One object of the invention is to provide a switching circuit with low conducted EMI characteristics.

Another object is to provide such a circuit which requires either little or no filtering of a switched high-power AC signal, and which does not require the large and expensive components heretofore needed.

A further object is to provide such a circuit which makes it easier to meet applicable standards, particularly MIL-STD-461A(3) test CE03, even in high-power 3-phase applications.

A still further object is to provide such a circuit which is physically small and lightweight.

An additional object is to provide such a circuit which has a relatively low cost.

Yet another object is to generally improve on the prior art.

The invention proceeds from a realization that existing power switching elements, such as SCR's TRIAC's, etc. can never turn AC signals on and off exactly at zero-crossover. For example, an SCR cannot turn on and conduct current until the AC signal has reached the minimum threshold junction voltage and cannot stay turned on after the AC signal has dropped below that voltage. Put another way, the conduction characteristic of conventional power switching elements is non-smooth in the transition region about zero-crossover; small changes in voltage across the switching element cause disproportionally large changes in current through the switching element, as compared with corresponding changes in current that would take place outside the transition region. It is these non-smooth conduction characteristics which introduce conducted EMI into AC signals which are switched using conventional components.

In accordance with the invention, there is provided a switching circuit having a pass network and a bypass network. The pass network includes a switching element having a non-smooth conduction characteristic in the transition region of the AC signal to be switched. The bypass network is connected in parallel with the pass network and has a smooth conduction characteristic in the transition region.

By suitable operation of the pass and bypass networks, the AC signal is shunted through the bypass network when the non-smooth conduction characteristics of the switching element would introduce conducted EMI. The effective conduction characteristic of the switching circuit as "seen" by the switched AC signal is smooth, or at least substantially smoother than that of the switching element itself.

BRIEF DESCRIPTION OF THE DRAWINGS

The invention will be better understood with reference to the following illustrative and non-limiting drawings, in which:

FIGS. 13 and 13A show the effect of the FET in the first preferred embodiment at the beginning of positive half-cycle conduction;

DETAILED DESCRIPTION OF PREFERRED EMBODIMENTS

Figure 1:
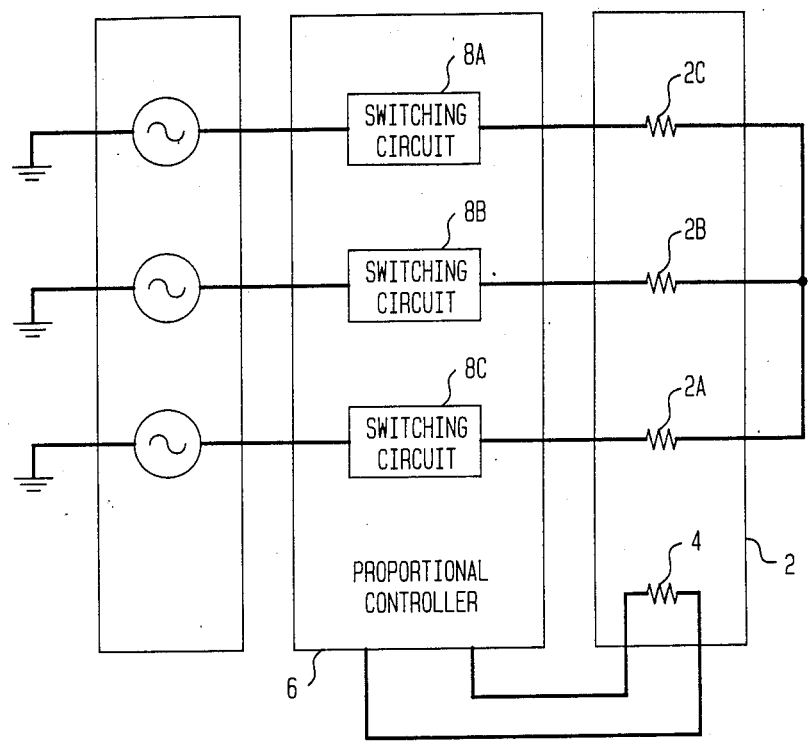
FIG. 1 is a block diagram of a system in which the invention may be used.

The environment for the preferred embodiment is illustrated in FIG. 1. Here, a three-phase 120 volt 400 Hz resistive load 2 (such as an anti-icing or deicing electric heater mounted on the exterior of a military or civilian aircraft) has three resistive branches 2A, 2B, 2C connected in a floating center wye configuration, i.e. connected together at an ungrounded circuit point. Neither the configuration of the load 2 nor the load 2 itself is part of the invention; the load 2 could be connected in a delta configuration.

A temperature sensor 4 is thermally connected to the load 2 and has a resistance which varies with the temperature of the load 2. The sensor 4 is connected to a proportional controller 6, which so regulates the current in each phase 2A, 2B, 2C of the load as to keep the load temperature constant at a predetermined level.

Figure 2:
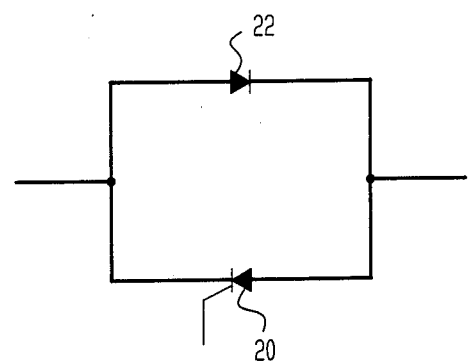
FIG. 2 is a schematic diagram of a known switching circuit.

To accomplish this regulation, there is provided a switching circuit 8A, 8B, 8C in each phase 2A, 2B, 2C of the load; the switching circuits 8A, 8B, 8C are preferably identical. A known switching circuit of this type is illustrated in FIG. 2. In this switching circuit, there is provided an SCR 20 (for example a GE type C137) which is connected in inverse parallel with a power diode 22 (for example a type 1N3768). This switching circuit is driven by suitable circuitry (not shown) which supplies pulses to the gate of the SCR 20 and which thereby turns the SCR 20 on with a duty factor appropriate to the power to be supplied by the phase. For example, when the switching circuit is turned full on, one pulse is sent to the gate of the SCR 20 at the beginning of each new cycle from the AC source.

At current levels typical of aircraft deicing heaters, the switching circuit illustrated in FIG. 2 produces conducted EMI which exceeds limits permissible under MIL-STD-461A(3) test CE03, regardless of the circuitry used to trigger the SCR 20, and it is therefore necessary to filter the output of the FIG. 2 switching circuit to remove the excess conducted EMI. This is because it has not been proved possible to deliver a gate signal to the SCR 20 which will insure that the SCR 20 turns on at the precise beginning of a negative half-cycle and and stays on until the precise ending of that half-cycle.

Figure 3:
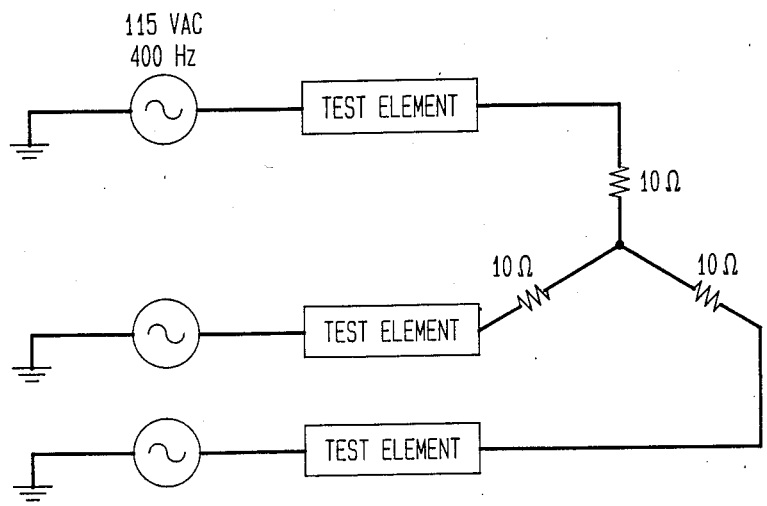
FIG. 3 is a schematic diagram of a circuit used to illustrate the properties of various parts used in the circuit of FIG. 2.
Figure 4:
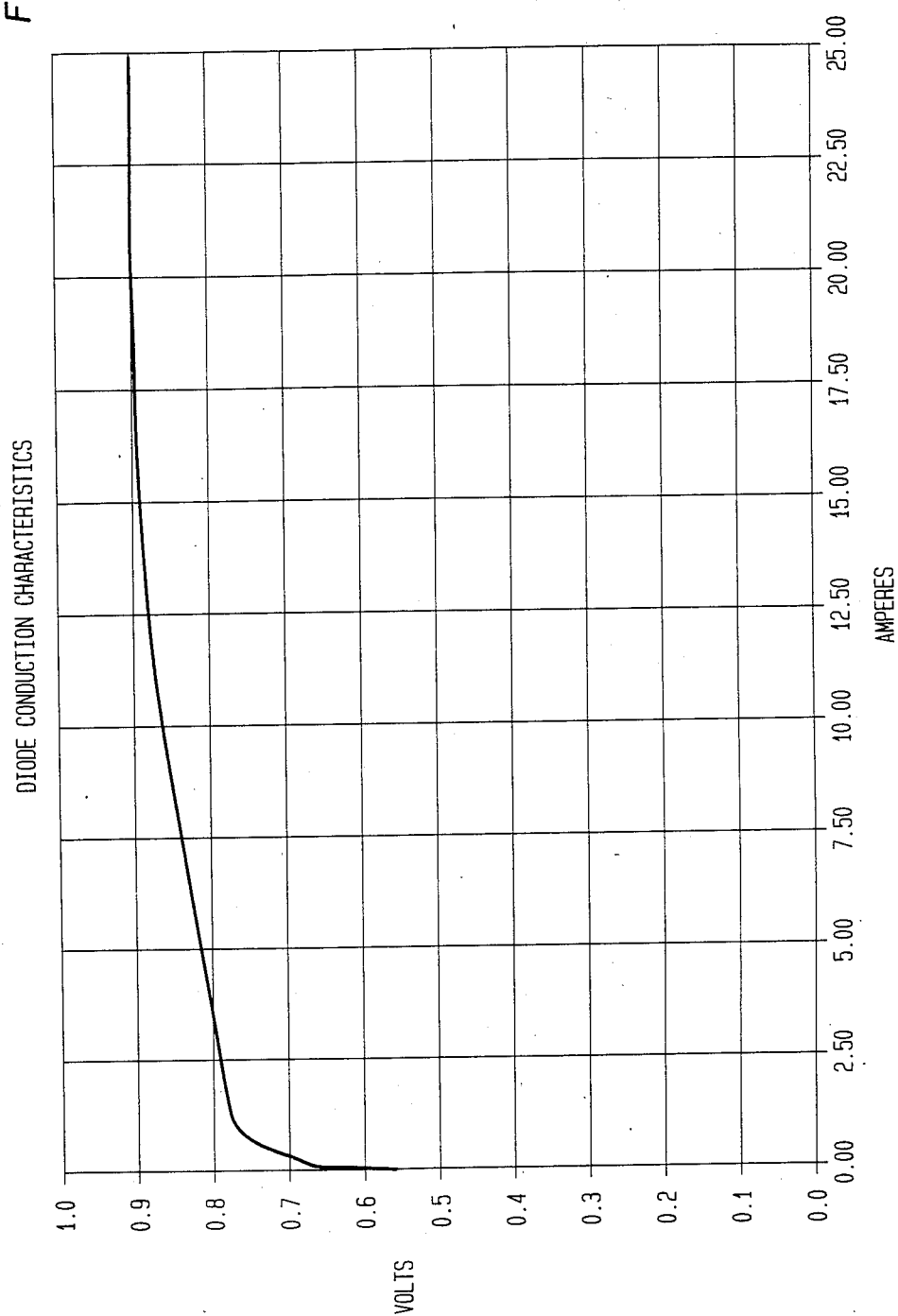
FIG. 4 shows the conduction characteristic of a power diode used in the circuit of FIG. 2.

To explain the excessive conducted EMI produced by the switching circuit of FIG. 2, it is appropriate to discuss the characteristics of that circuit's constituent components, when the switching circuit is connected as per FIG. 3. In FIG. 4, the component illustrated is the power diode 22. (FIG. 4 is based on measured data taken from this diode, but is presented for illustrative purposes only.)

The power diode 22 has a non-smooth conduction characteristic below a forward bias voltage of about 0.6 volts. This is because a power diode 22 can only conduct if the voltage across it exceeds the P-N junction voltage typical of a silicon diode at room temperature. Put another way, the power diode 22 does not fully turn on until there is a voltage across it of at least 0.6 volts, and until that voltage is reached, there is a non-smooth relationship between the voltage across the power diode 22 and the current flowing through it. Thus, in the transition region about zero volts AC, the power diode 22 may be said to have a non-smooth conduction characteristic.

Figure 5:
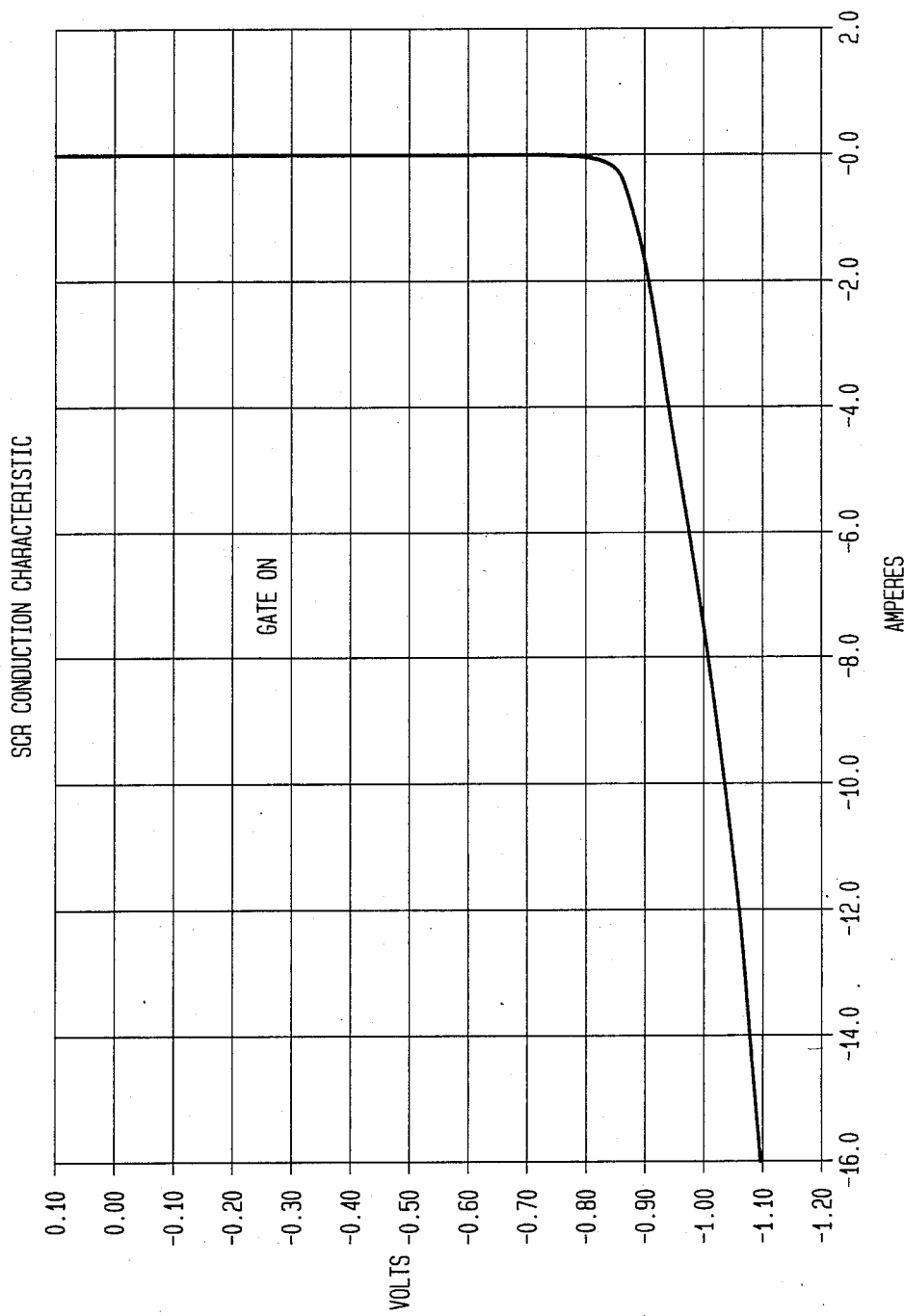
FIG. 5. shows the conduction characteristic of an SCR used in the circuit of FIG. 2.

FIG. 5 shows what happens in the SCR 20. (This Figure is based on measured data for this part with the gate on, but is not to scale and is shown for illustrative purposes only.) The SCR 20 has a non-smooth conduction characteristic in the transition region about zero volts AC. This non-smooth conduction characteristic is evidenced by the sharp change in direction of the graph at about 0.6 volts.

Figure 6:
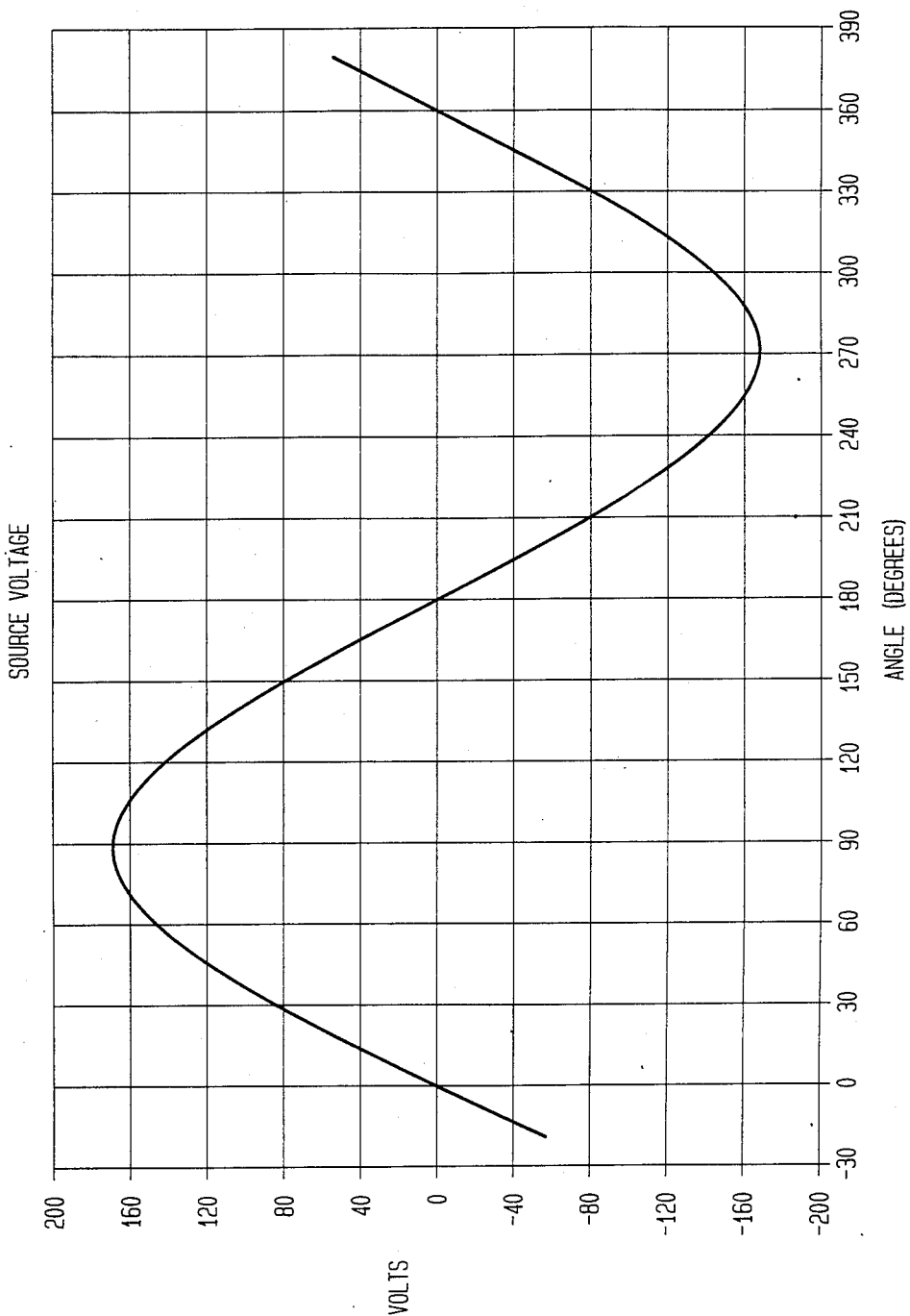
FIGS. 6 and 6A illustrate the characteristics of an ideal pass element in the circuit of FIG. 3.
Figure 6A:
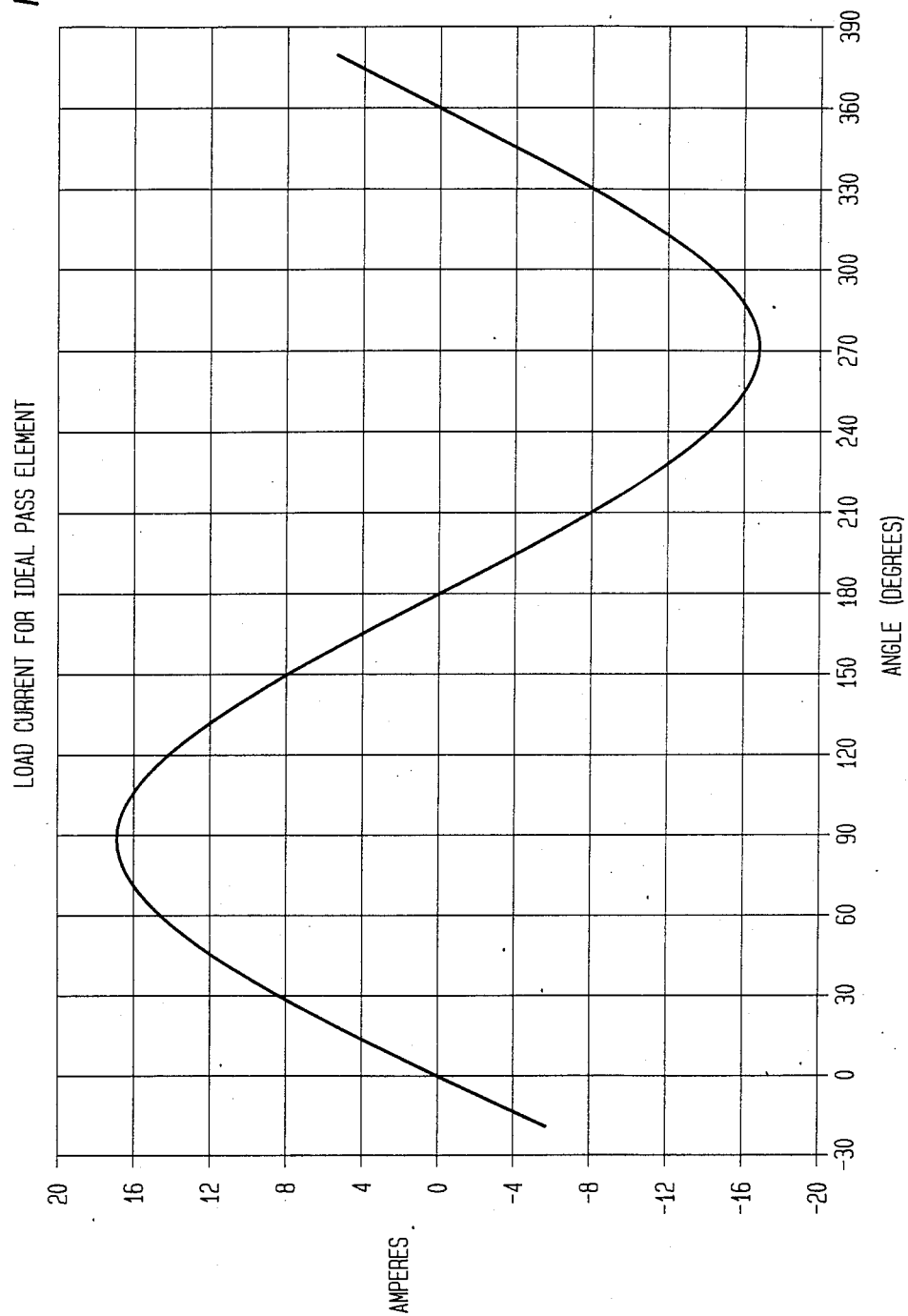
Figure 7:
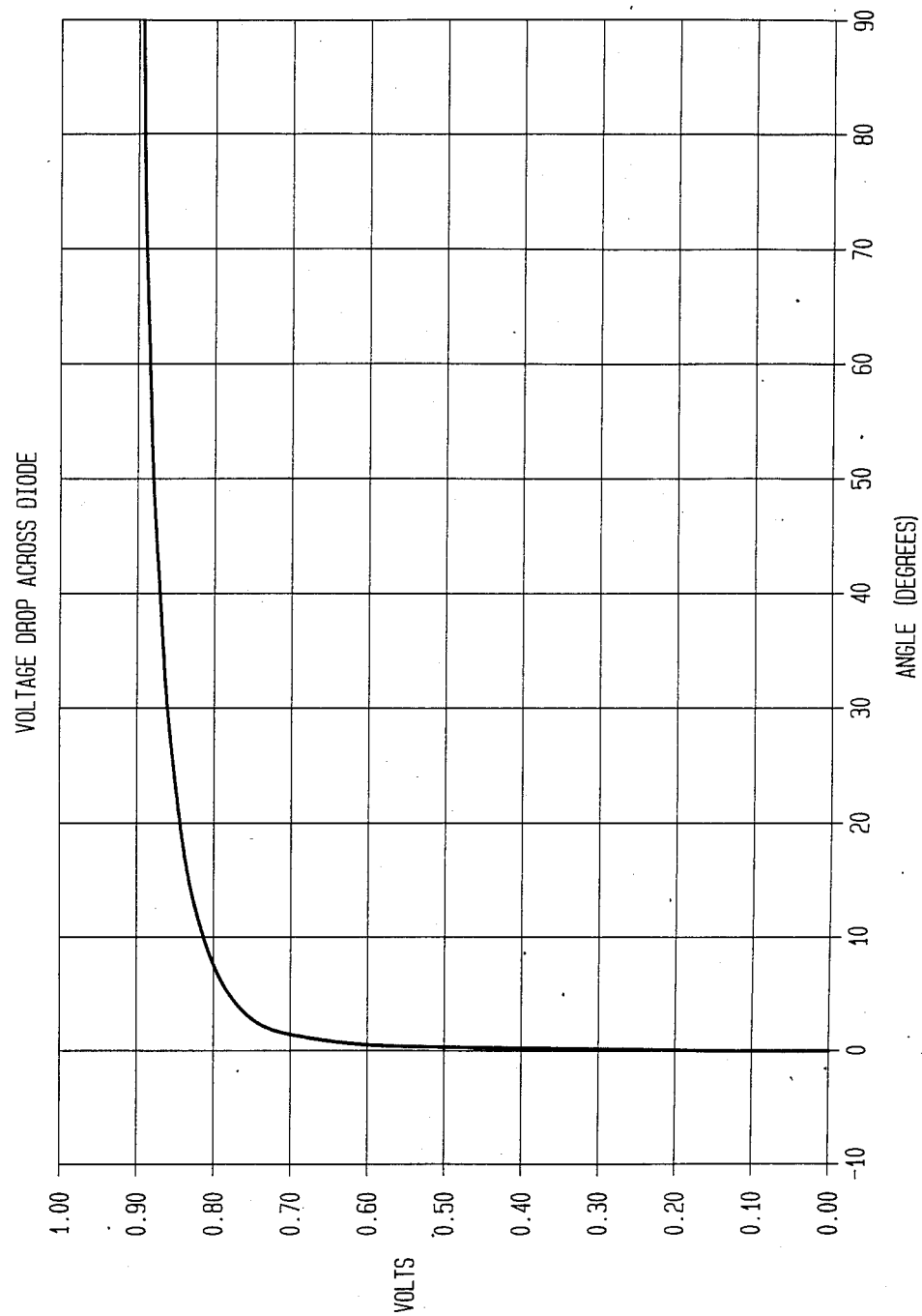
FIGS. 7 and 7A show the voltage drop across a diode used in the circuit of FIG. 2 during the beginning of positive half-cycle conduction.
Figure 7A:
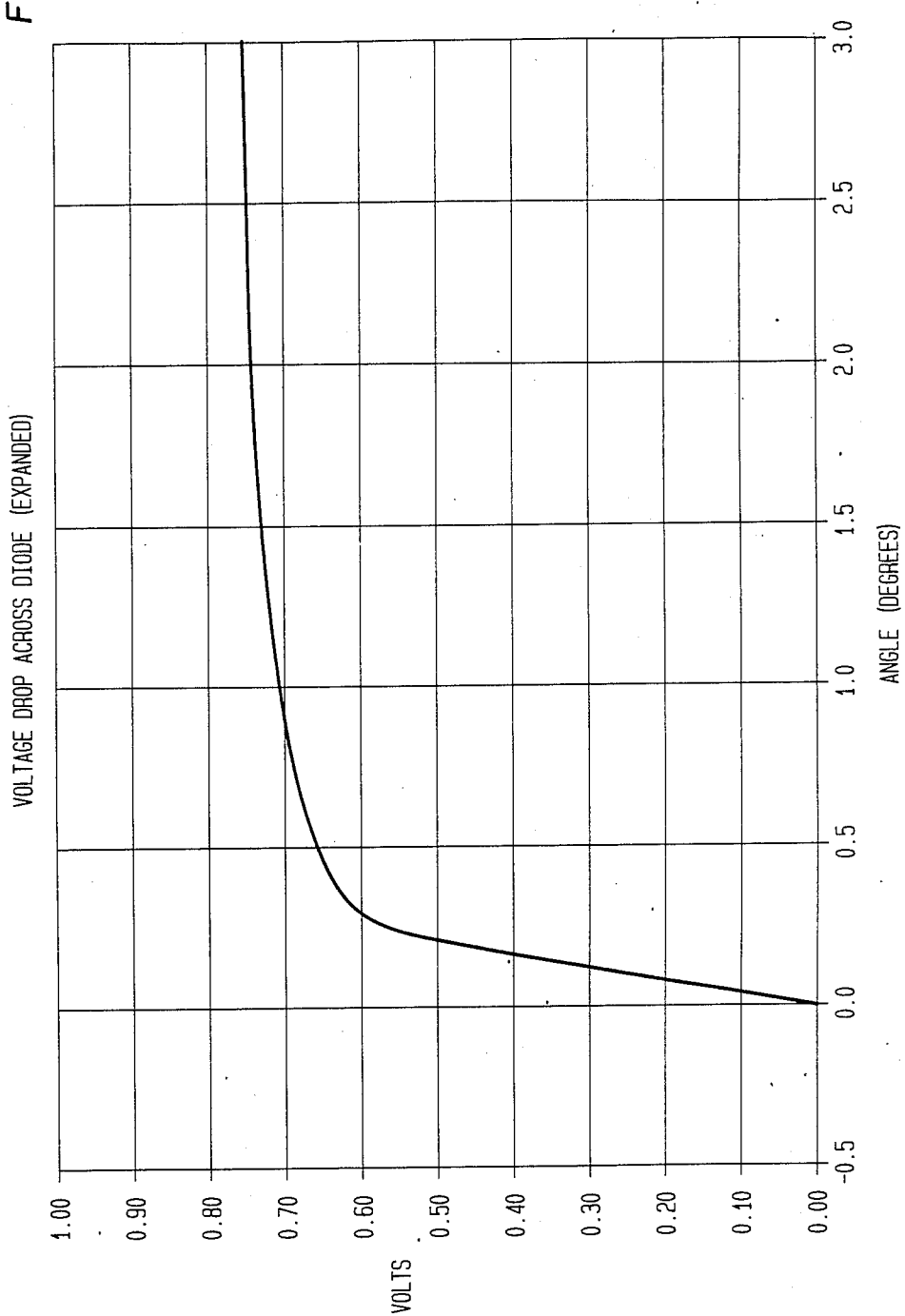

The effect of the non-smooth conduction characteristic of the power diode 22 will now be described. Ideally, as is shown in FIGS. 6 and 6A, a pass network leaves the relationship between source voltage and load current undisturbed; both remain in phase. However, this relationship is disturbed even during positive half-cycle conduction by the power diode 22's non-smooth conduction characteristic, which is shown in FIGS. 7 and 7A. This is because, in the transition region, the load current does not vary in proportion with the source voltage. Only when the power diode 22 is fully conductive, i.e. only after approximately 0.6 volts, or about 0.25° into a positive half-cycle, do source voltage and load current follow each other smoothly.

Figure 8:
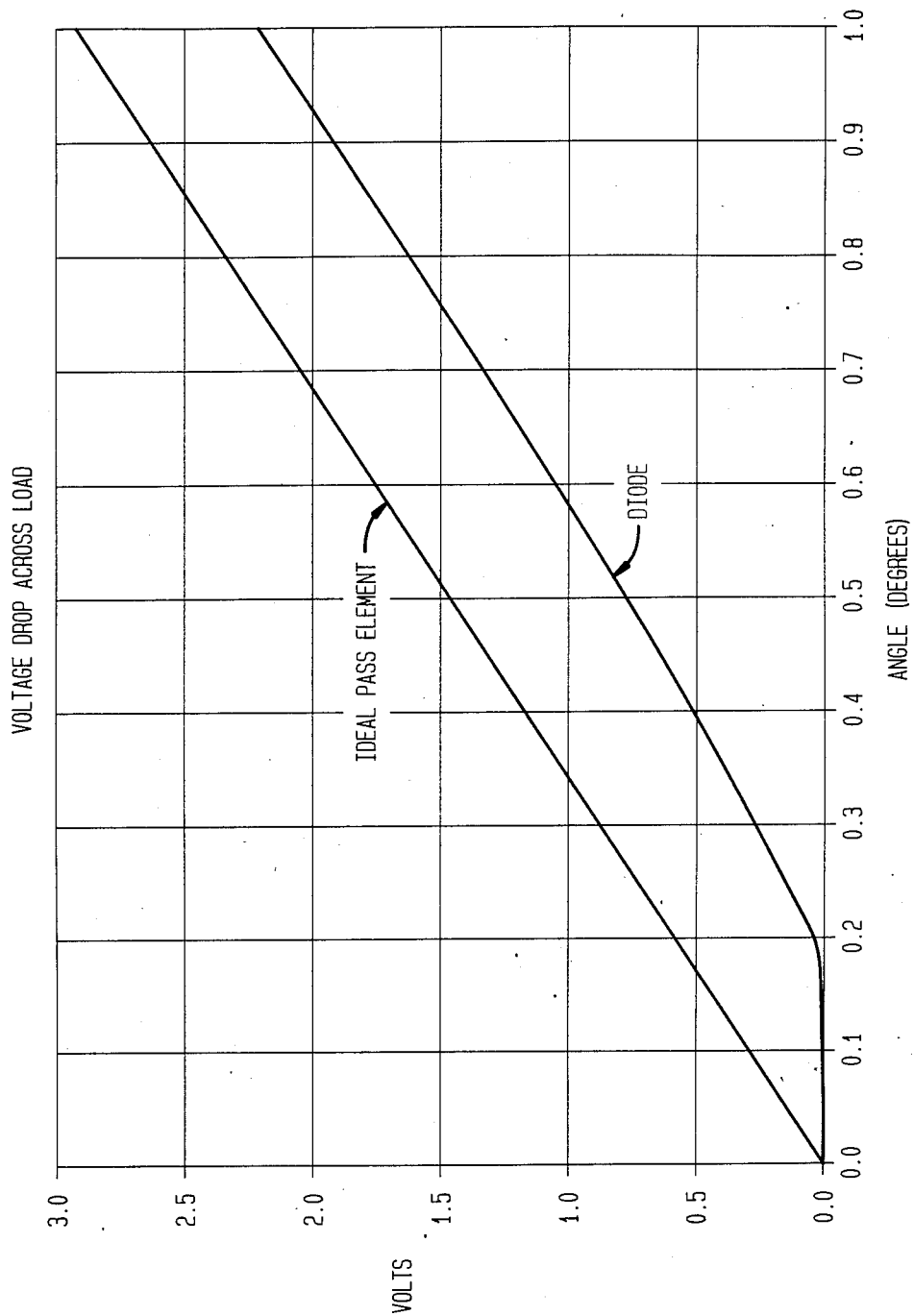
FIGS. 8 and 8A show the effect of the diode used in the circuit of FIG. 2 as compared to an ideal pass element, at the beginning of positive half-cycle conduction.
Figure 8A:
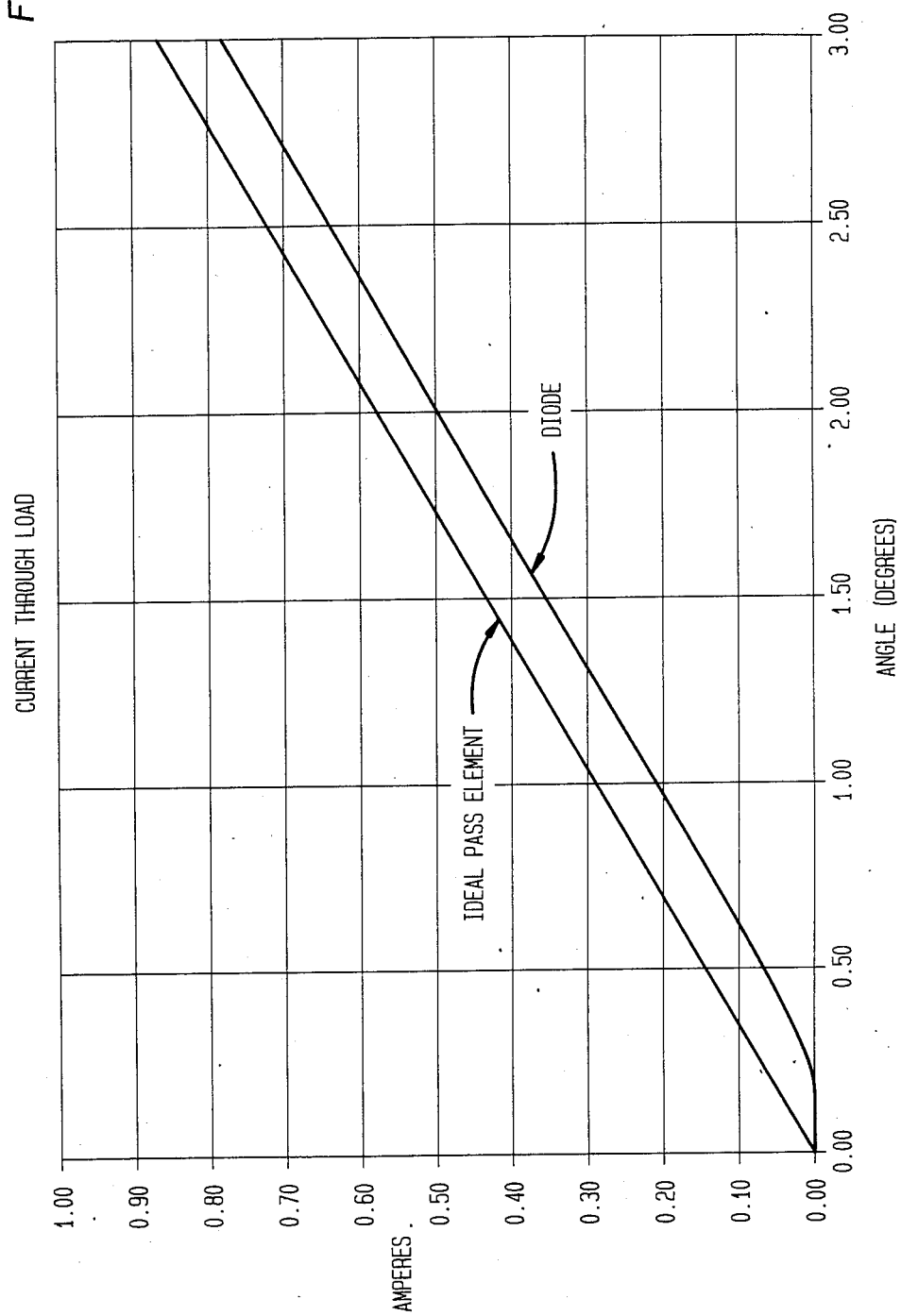

The difference between an ideal pass element in the first few degrees of a positive half-cycle and a conventional power diode 22 is illustrated (in an exemplary manner, not to scale) in FIGS. 8 and 8A. These Figures show that in the initial degrees of conduction during a positive half-cycle, load current leads source voltage.

Figure 9:
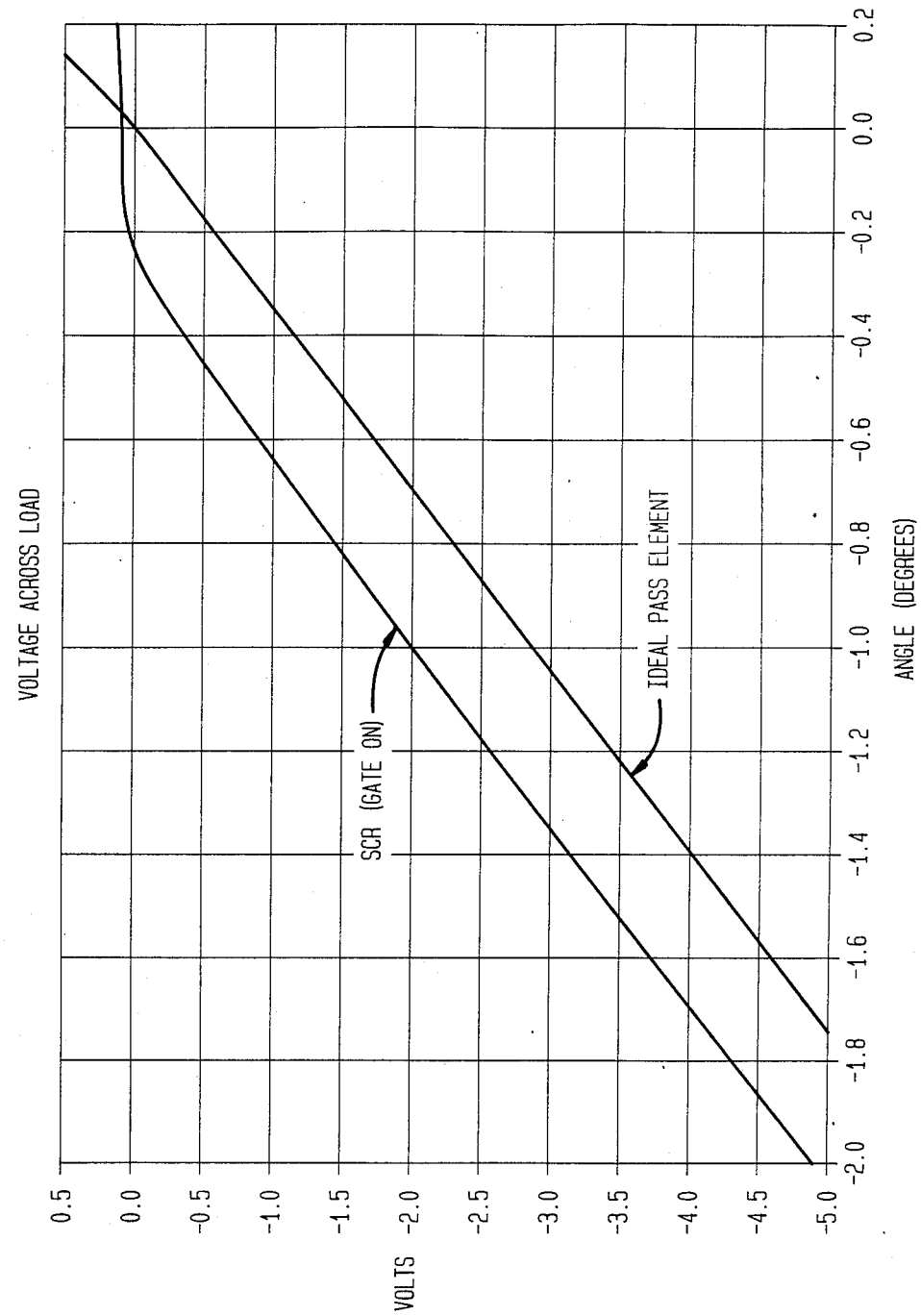
FIGS. 9 and 9A show the effect of the SCR used in the circuit of FIG. 2 as compared to an ideal pass element, at the end of negative half-cycle conduction.
Figure 9A:
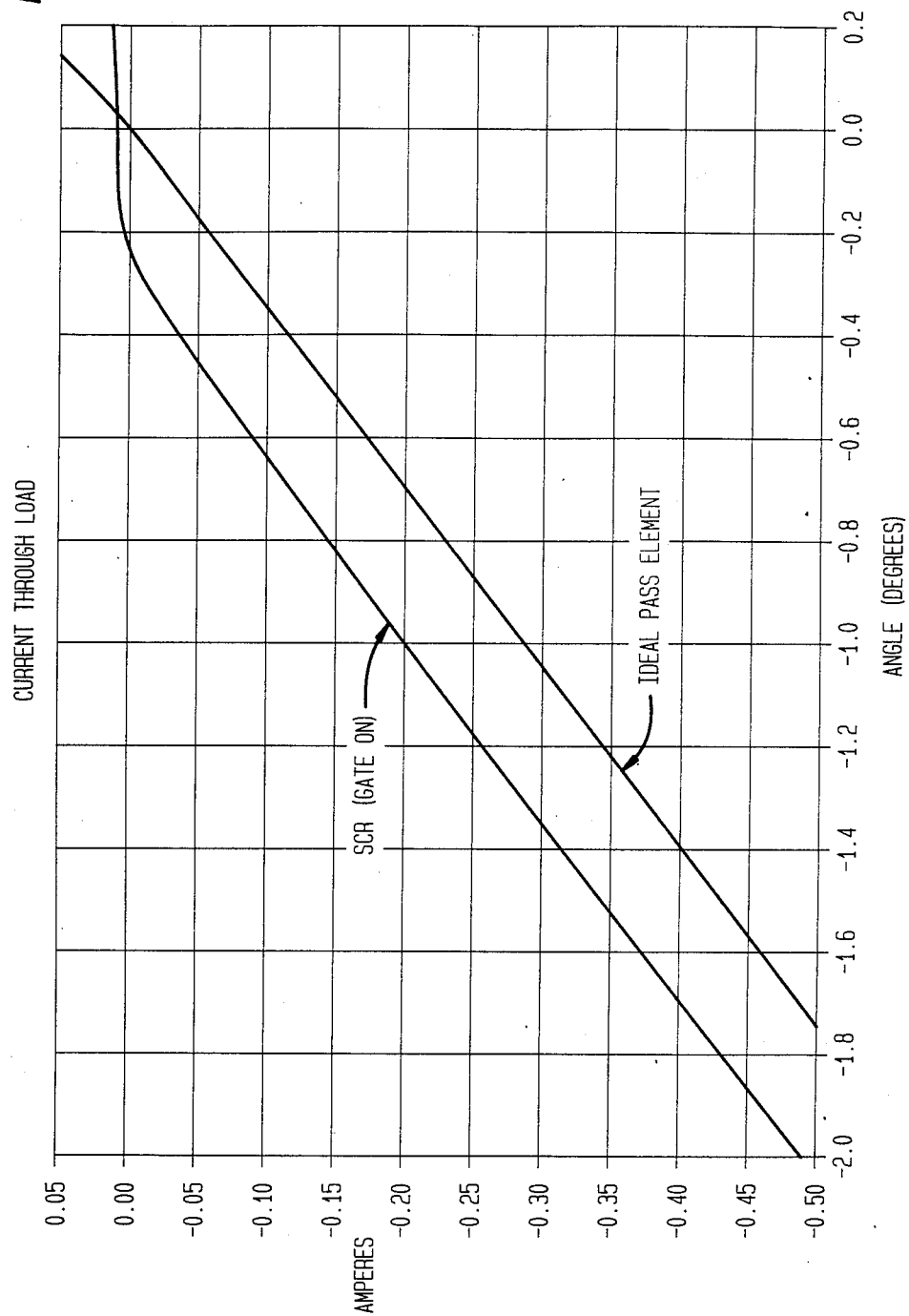

The effect of the non-smooth conduction characteristic of the SCR 20 during the negative half-cycle of conduction will now be discussed. As is shown in FIG. 5, the conduction characteristic of the SCR 20 becomes non-smooth at approximately −0.8 volts (at approximately 0.2° before zero-crossover). This is because an SCR 20 cannot remain conductive if there is insufficient voltage across it to overcome the threshold junction voltage. The effect of the SCR 20 as compared to an ideal pass element is shown in FIGS. 9 and 9A; in the last degrees of conduction during a negative half-cycle, load current lags source voltage.

Hence, in the known switching circuit illustrated in FIG. 2, the non-smooth conduction characteristics of the power diode 22 and the SCR 20 in the transition region about zero-crossover causes source voltage and load current to become out of phase with each other; this causes conducted EMI. This cause cannot be eliminated by changing the way in which the SCR 20 is fired; even if the gate of the SCR 20 is tied to a positive voltage such that the SCR 20 would always be conductive on negative half-cycles, the conducted EMI would remain. While this explanation has proceeded based on the characteristics of two particular components, the components have characteristics which may be considered typical; all other power diode-SCR switching circuits also exhibit excessive conducted EMI at the current levels here considered.

Figure 10:
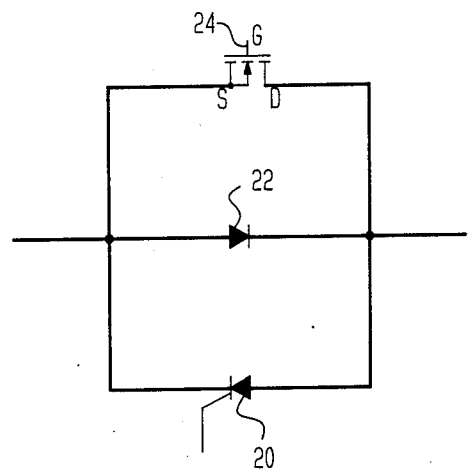
FIG. 10 is a schematic diagram of a first preferred embodiment of the invention.
Figure 11:
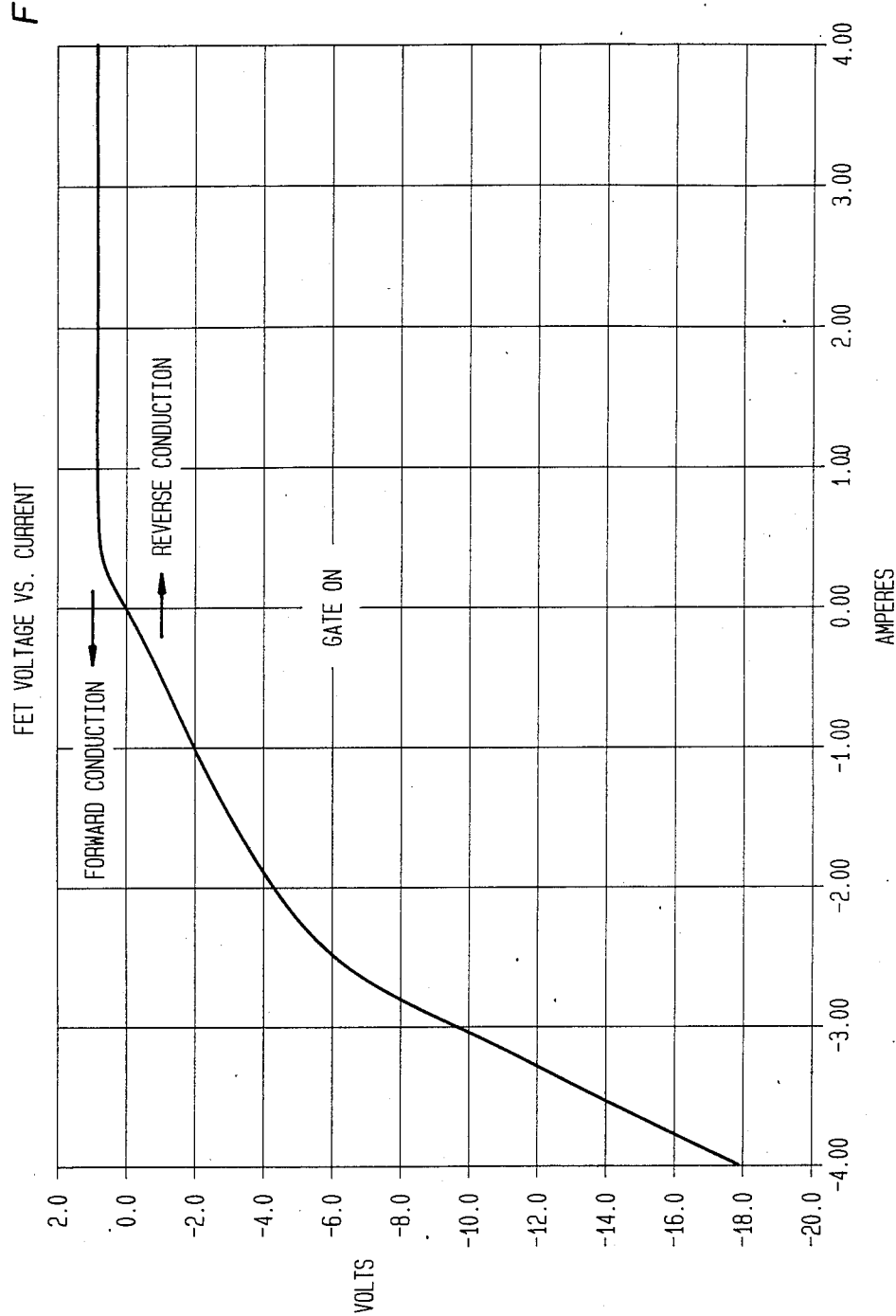
FIGS. 11 and 11A show the conduction characteristic of the FET used in the first preferred embodiment.
Figure 11A:
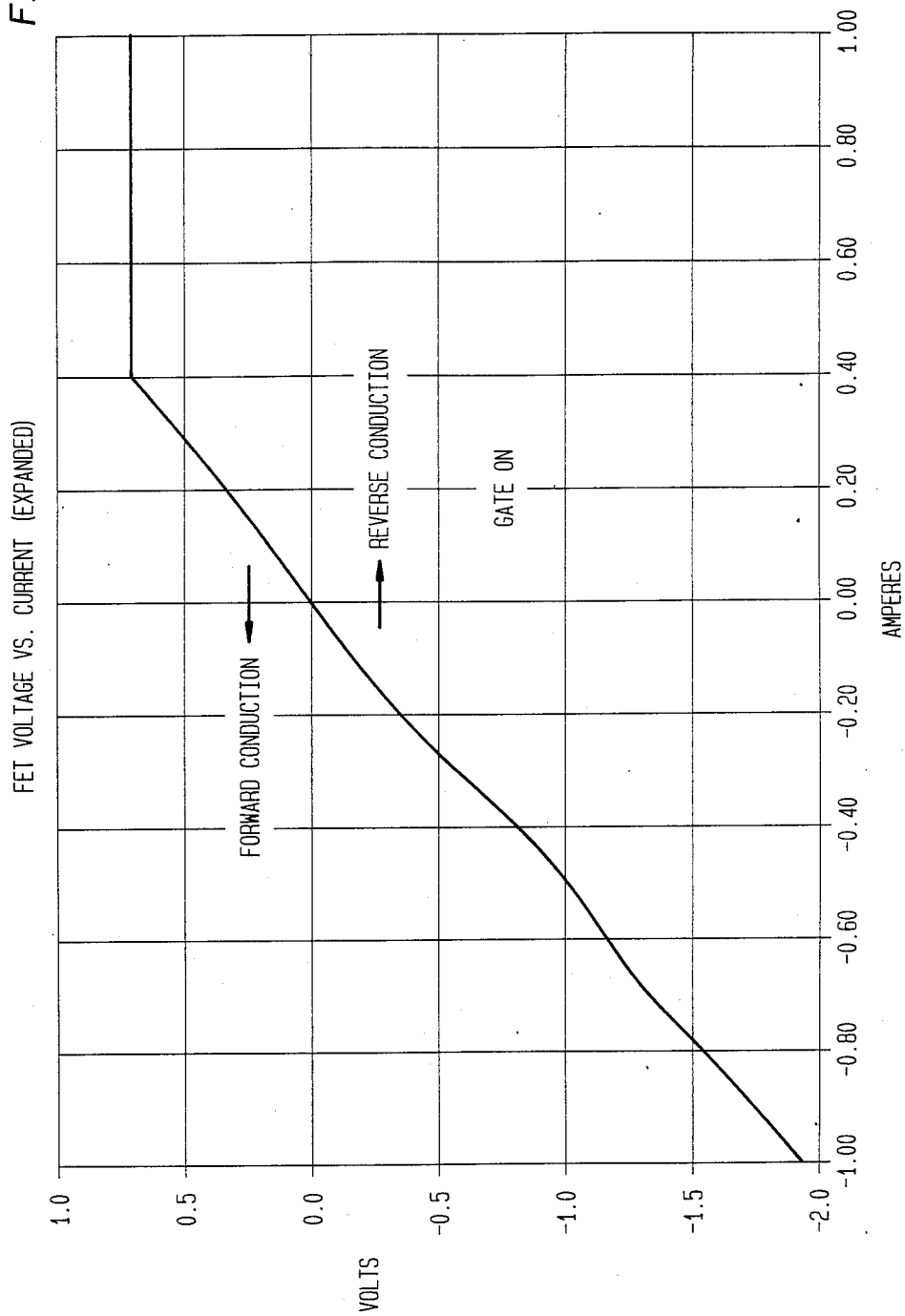

A preferred embodiment of the invention is shown in FIG. 10. Here, an FET 24 (such as a Siemens type BUZ 54A) is in parallel with the SCR 20 and power diode 22 in such a manner that the body diode of the FET 24 (described below) is connected in inverse parallel with the SCR 20. To understand how this embodiment operates, it is necessary to understand the conduction characteristic of an FET 24; this is illustrated in FIGS. 11 and 11A.

An FET 24 with its gate on has two conduction modes: forward conduction and reverse conduction. In forward conduction, i.e. conduction from drain to source which is controlled by the gate to source voltage, the FET 24 acts like a resistor.

Figure 12:
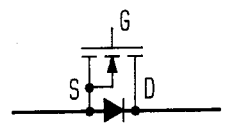
FIG. 12 is an equivalent circuit of the FET of FIGS. 11 and 11A.

In reverse conduction with the gate on, the FET 24 acts like a resistor up to about 0.7 volts. At a greater reverse voltage the FET 24 acts like a diode. This is because current manufacturing techniques for FET's create in the finished FET a body diode which conducts from source to drain (see equivalent circuit of an FET shown in FIG. 12). As a result, an actual FET 24 conducts in both directions; this is a characteristic which is utilized in the preferred embodiment. Thus, as can be seen in FIGS. 11 and 11A, while there is a distinct difference between the conduction characteristics of a FET 24 in its forward and reverse conduction modes, the overall conduction characteristic in the transition region about zero-crossover is smooth, or at least substantially smoother than that of the components previously described.

In accordance with the invention, and as is more fully explained below, the FET 24 is, in the preferred embodiment, used as a bypass for the SCR 20 and power diode 22. When the gate of the SCR 20 is to be turned on, the gate of the FET 24 is turned on at or before the beginning of a negative half-cycle and turned off after the beginning of a positive half-cycle. This essentially smooths out the conduction characteristic of the three component network, as "seen" by the AC current to be switched. As a result, conducted EMI is substantially reduced.

The following description will proceed on the assumption that the first preferred embodiment is turned full on, i.e. that during all relevant times, the gates of the SCR 20 and the FET 24 are high. This is to illustrate the workings of the first preferred embodiment. Persons skilled in the art will understand that to make the first preferred embodiment actually function as a switch, it is necessary to provide other circuitry (not shown) to control the gates of the SCR 20 and FET 24. To the extent that the preferred embodiments introduce new considerations into the design of such other circuitry, these new considerations will be discussed; the design of such other circuitry is otherwise straightforward.

Figure 13A:
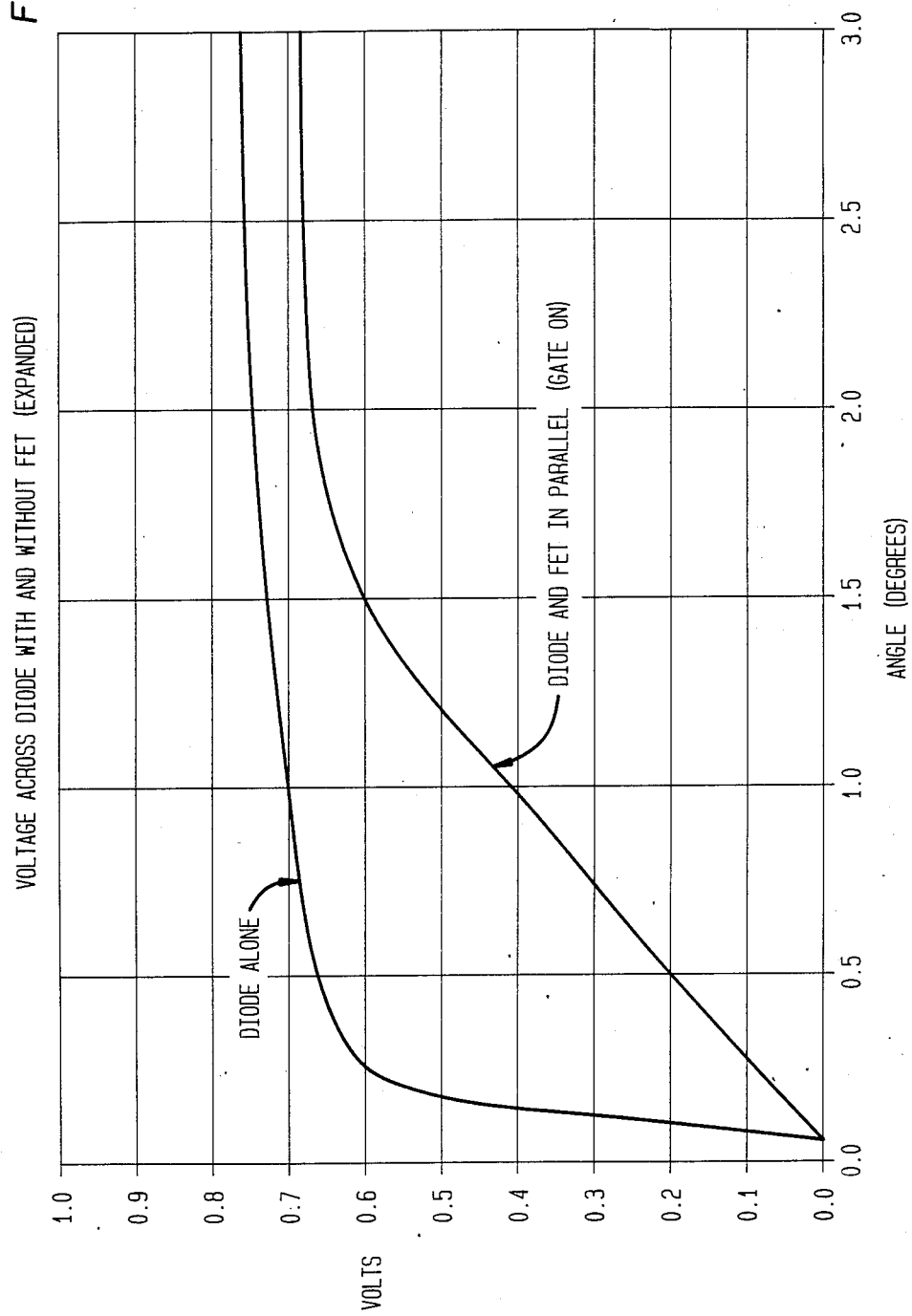

The effect of the FET 24 on conduction during the initial part of positive half-cycles will first be explained with reference to FIGS. 13 and 13A. The FET 24 begins conduction sooner than does the power diode 22, so that within the transition region about zero-crossover, the conduction characteristic of the two components together is much smoother than that of the power diode 22 alone.

Figure 14:
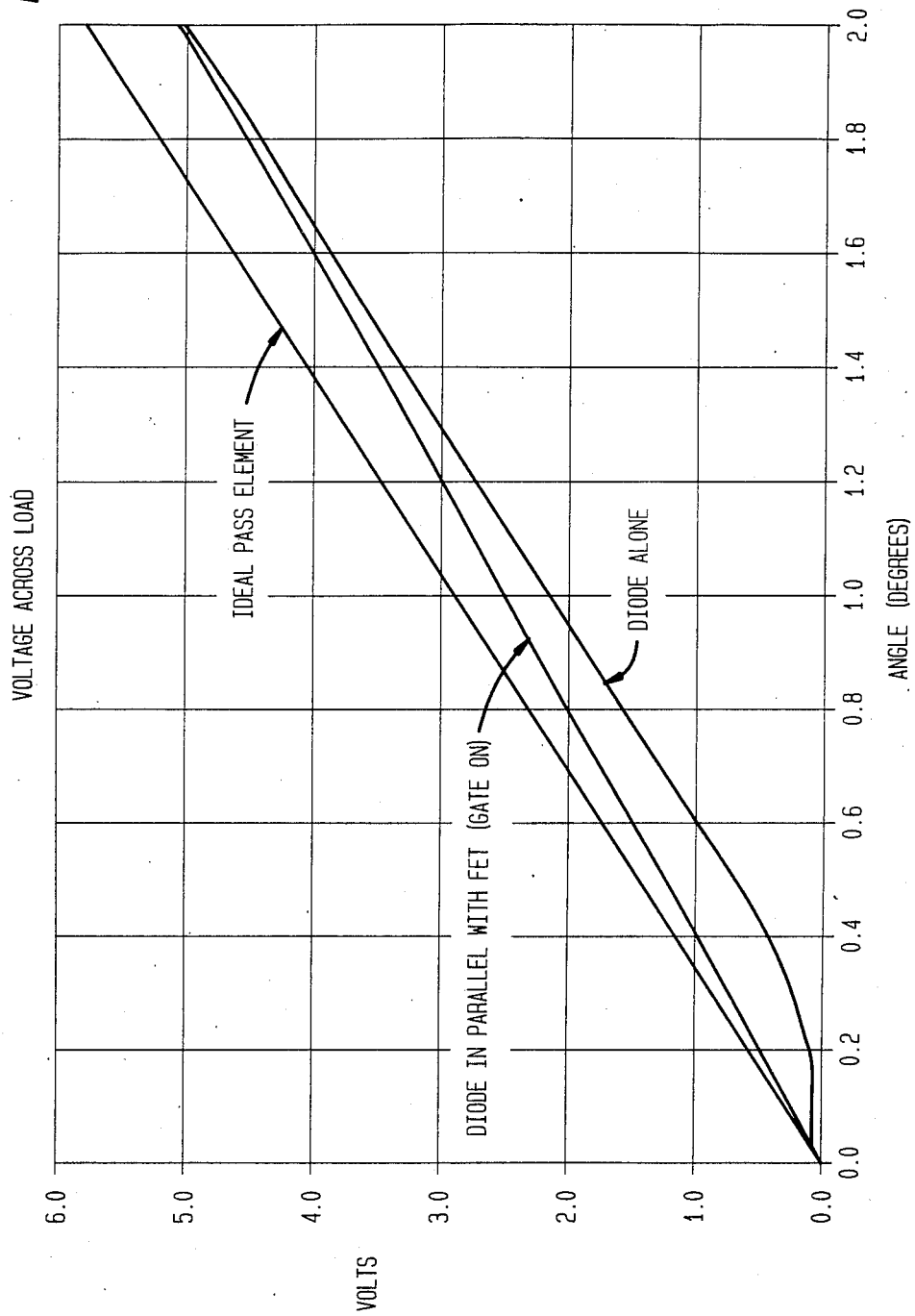
FIGS. 14 and 14A show the effect of the FET in the first preferred embodiment as compared with an ideal pass element, at the beginning of positive half-cycle conduction.
Figure 14A:
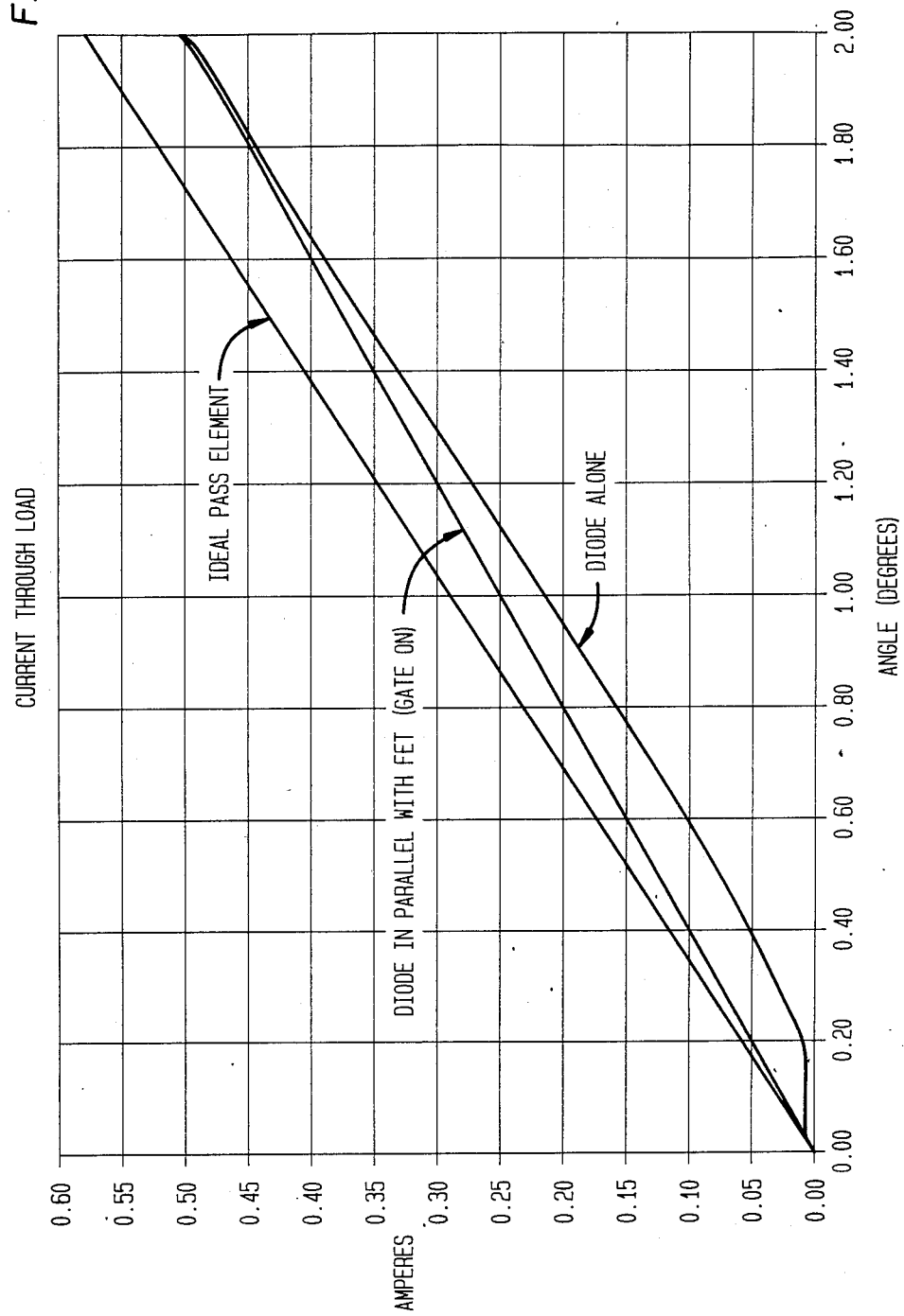

FIGS. 14 and 14A show that during the first few degrees of positive half-cycle conduction, the FET 24 bridges the difference between an ideal pass element and an actual power diode 22 used alone.

Figure 15:
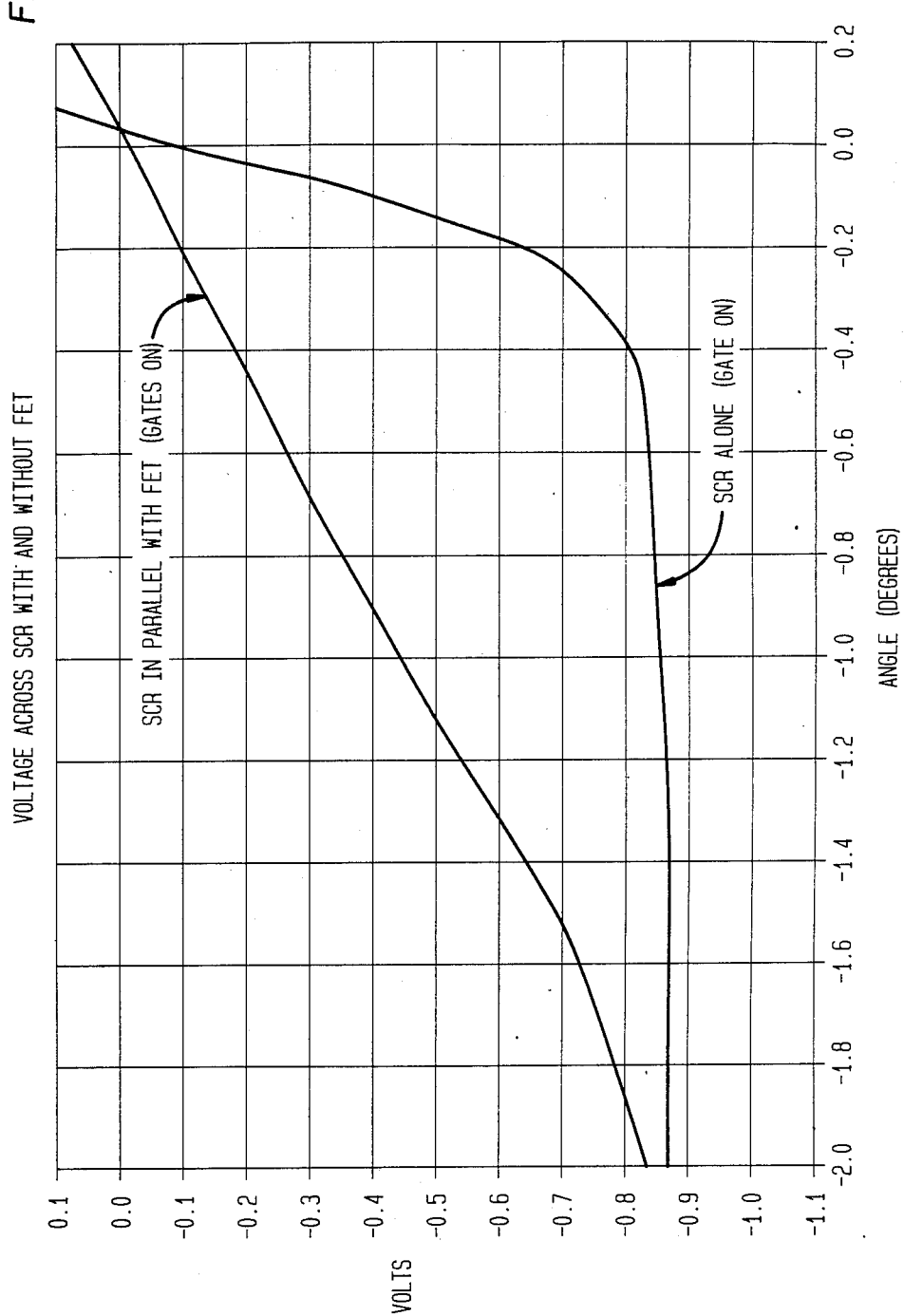
FIG. 15 shows the effect of the FET in the first preferred embodiment at the end of negative half-cycle conduction.
Figure 16:
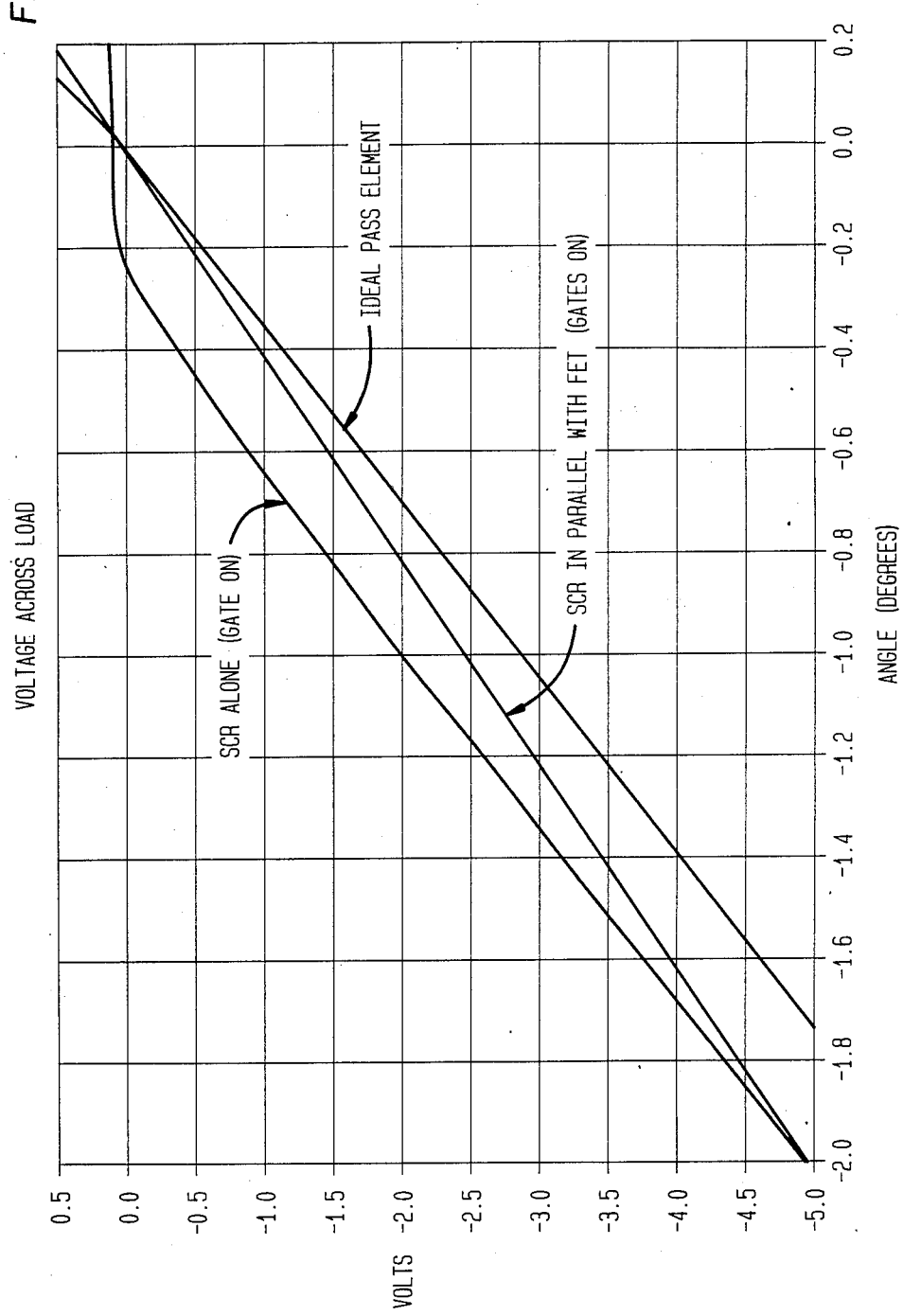
FIGS. 16 and 16A show the effect of the FET in the first preferred embodiment as compared with an ideal pass element, at the end of negative half-cycle conduction.
Figure 16A:
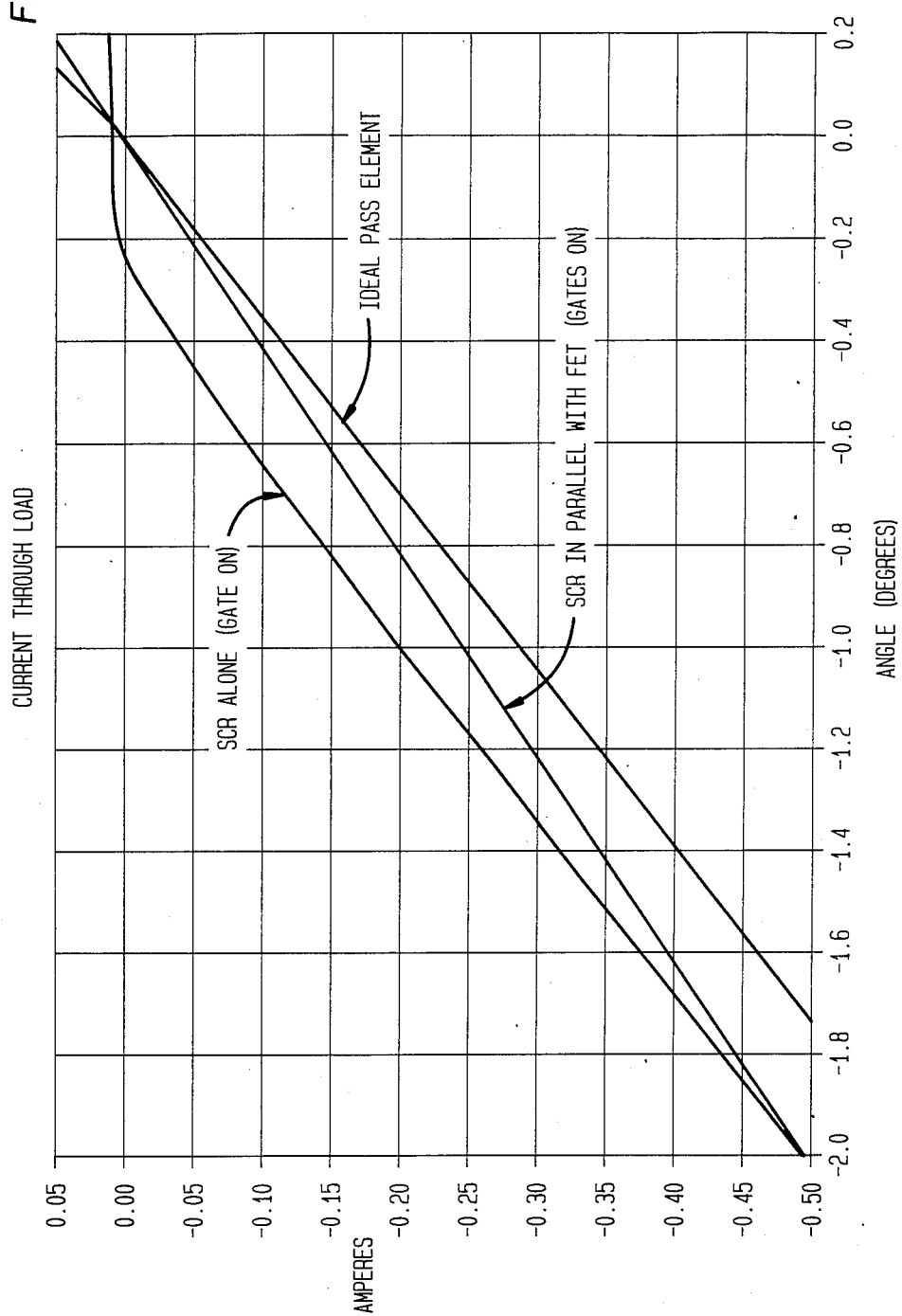

FIG. 15 shows the effect of the FET 24 during the last few degrees of negative half-cycle conduction. Here, the FET 24 acts like a resistor because it is conducting in the forward direction. Here again, the FET 24 smooths out the conduction characteristic of the SCR 20 within the transition region about zero-crossover. As shown in FIGS. 16 and 16A, during the last few degrees of negative half-cycle conduction, the FET 24 bridges the difference between an ideal pass element and an actual SCR 20 used alone.

Figure 17:
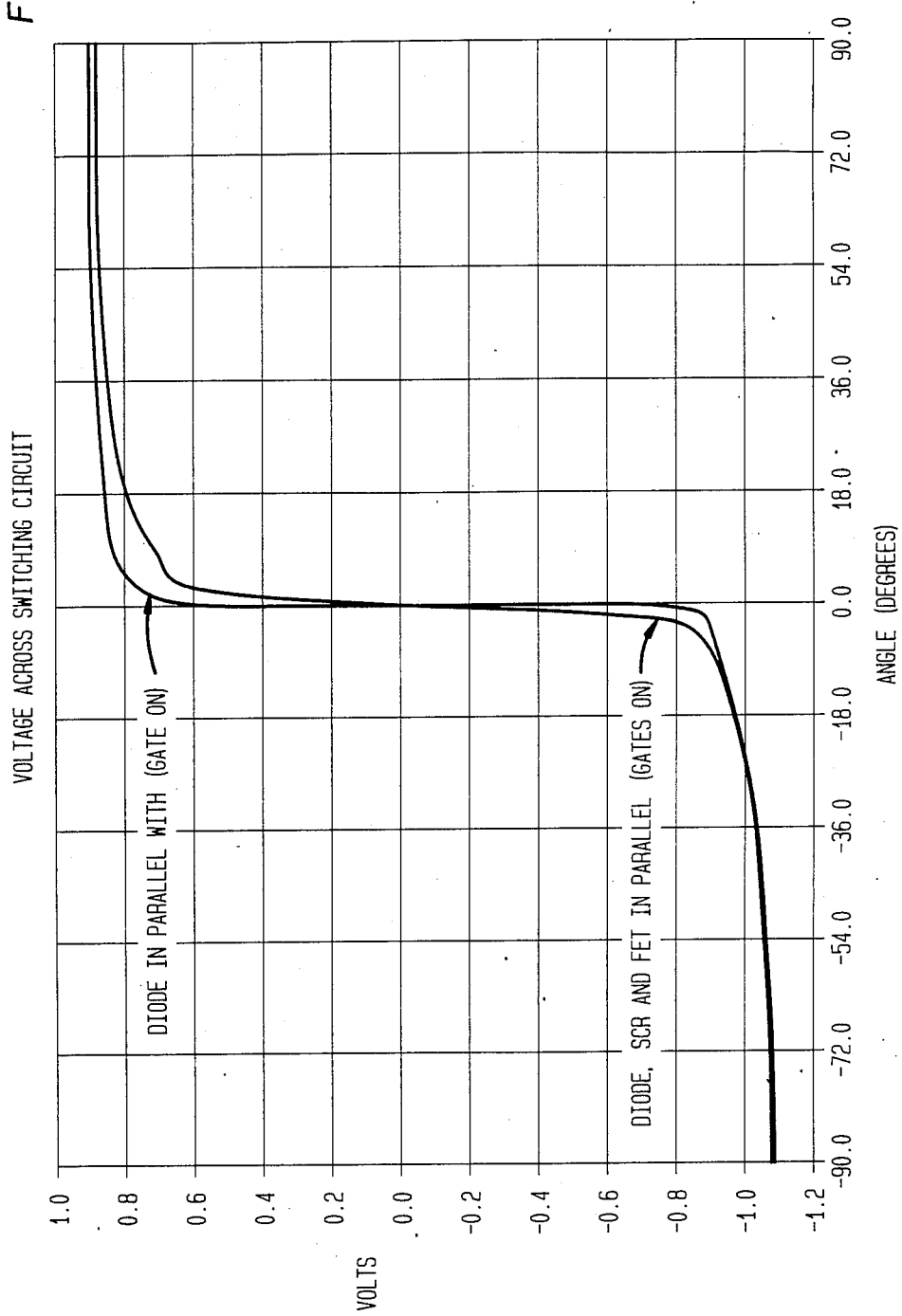
FIGS. 17, 17A and 17B compare the characteristics of the first preferred embodiment with those of the circuit of FIG. 2 at a positive-going transition across zero.
Figure 17A:
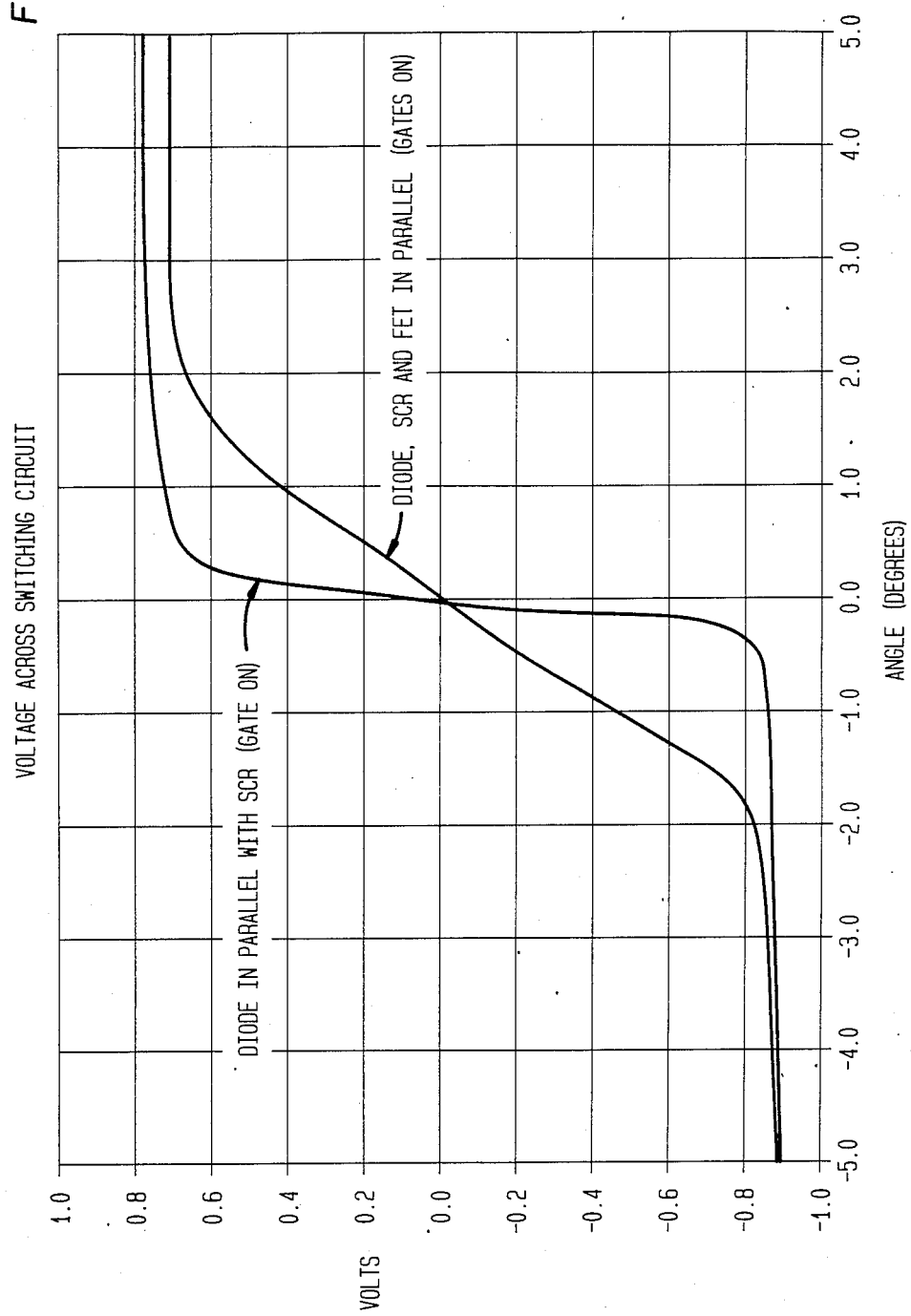
Figure 17B:
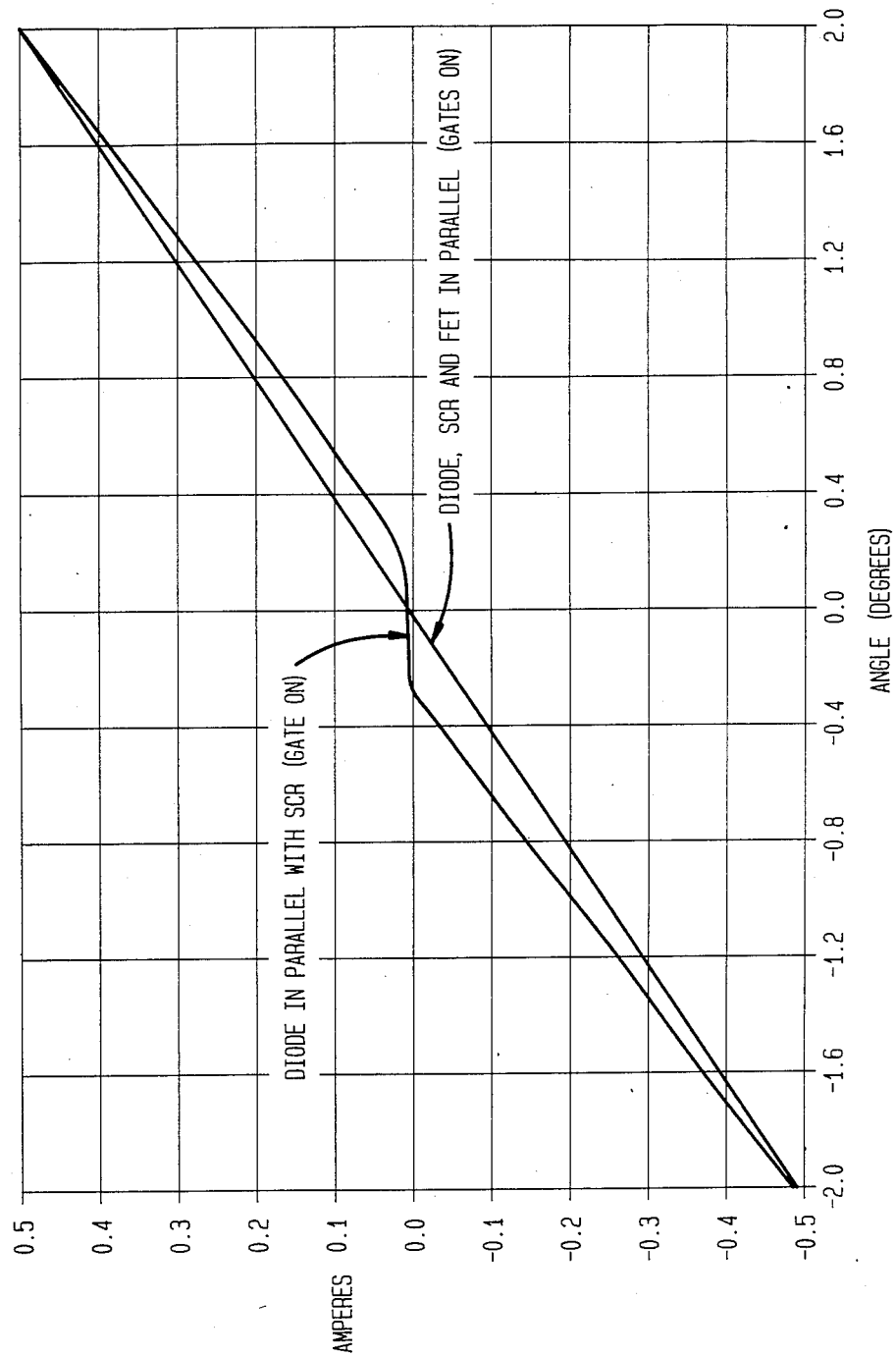
Figure 18:
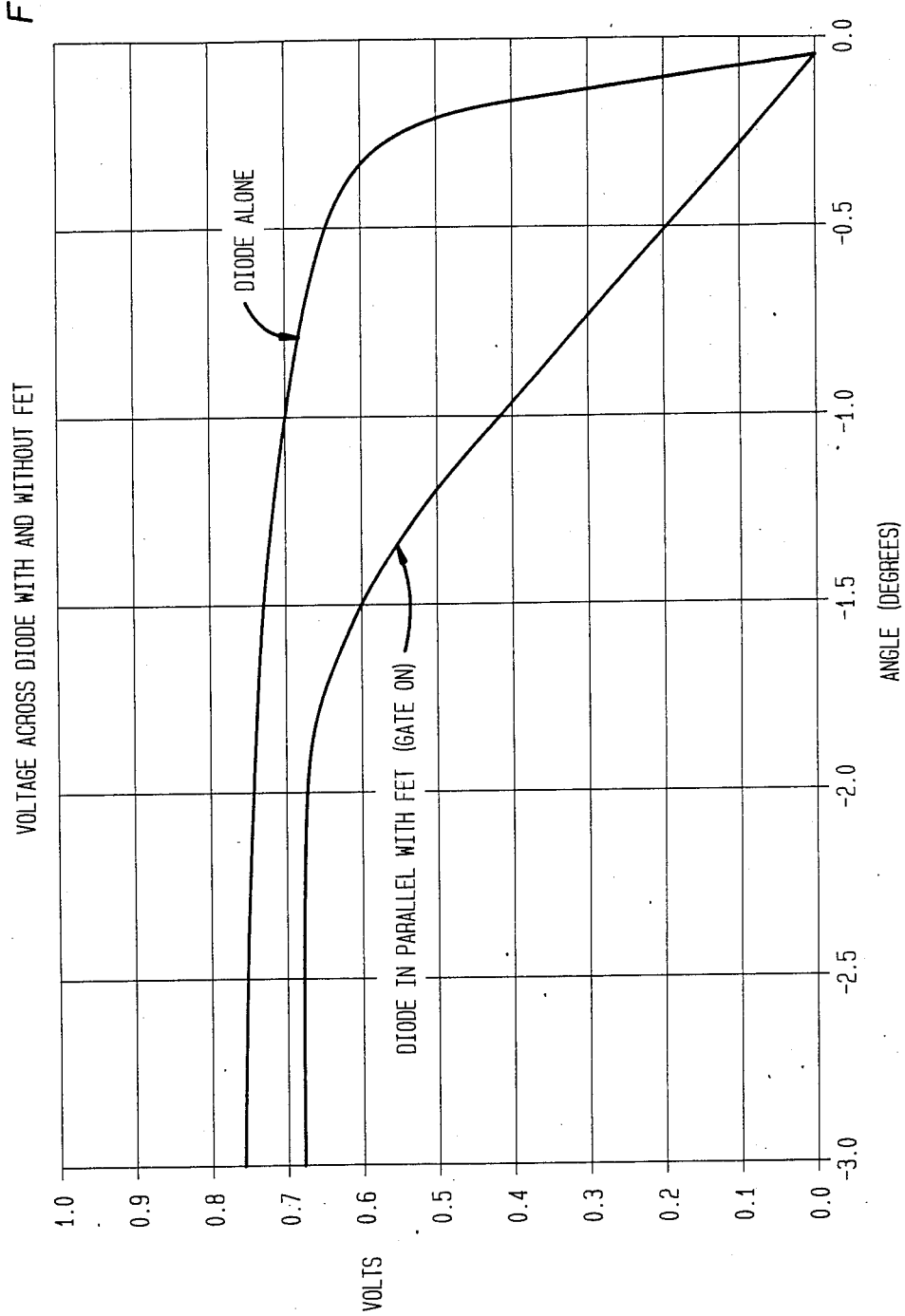
FIG. 18 shows the effect of the FET in the first preferred embodiment at the end of positive half-cycle conduction.
Figure 19:
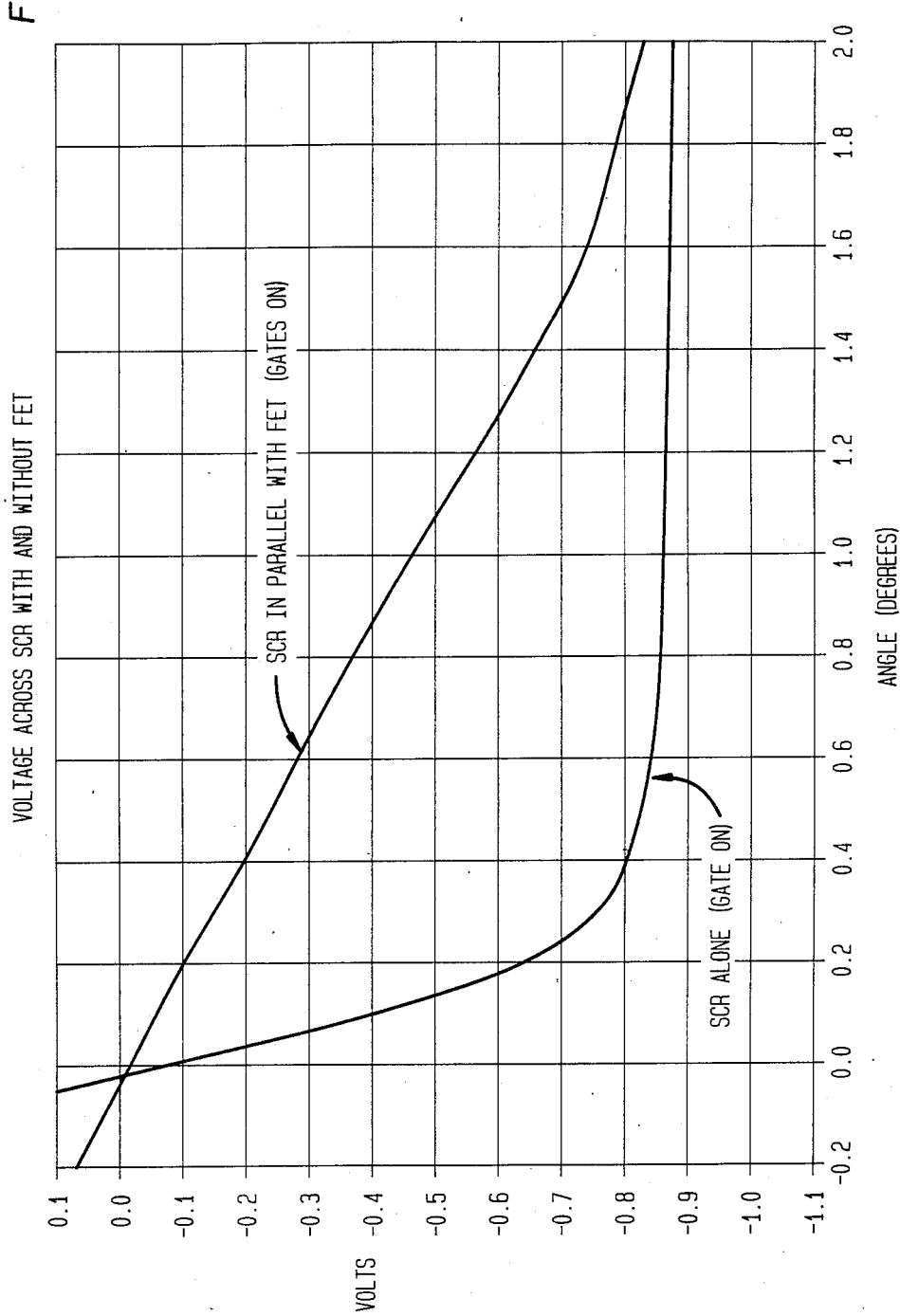
FIG. 19 shows the effect of the FET in the first preferred embodiment at the beginning of negative half-cycle conduction.
Figure 20:
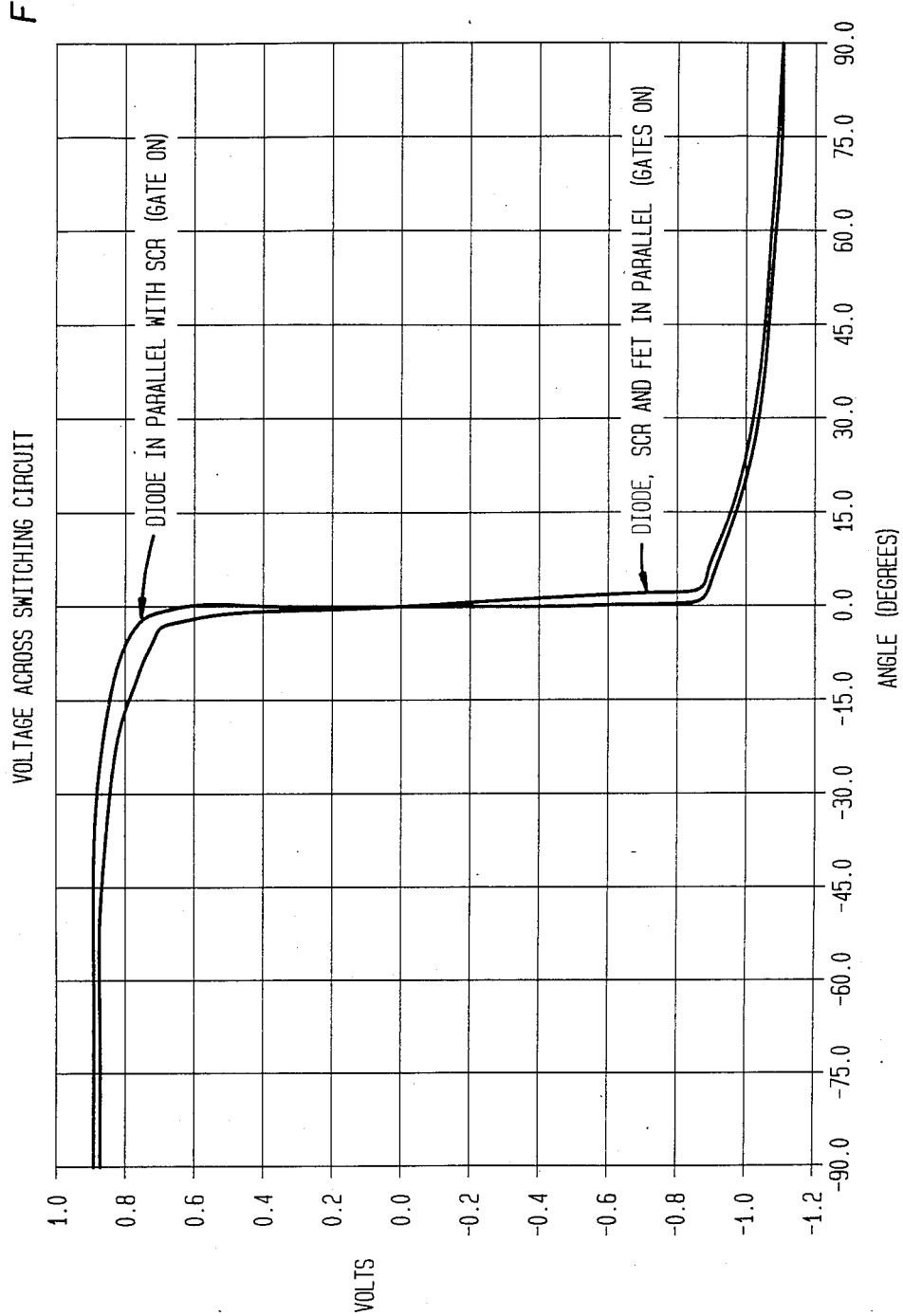
FIGS. 20, 20A and 20B compare the characteristics of the first preferred embodiment with those of the circuit of FIG. 2 at a negative-going transition across zero.
Figure 20A:
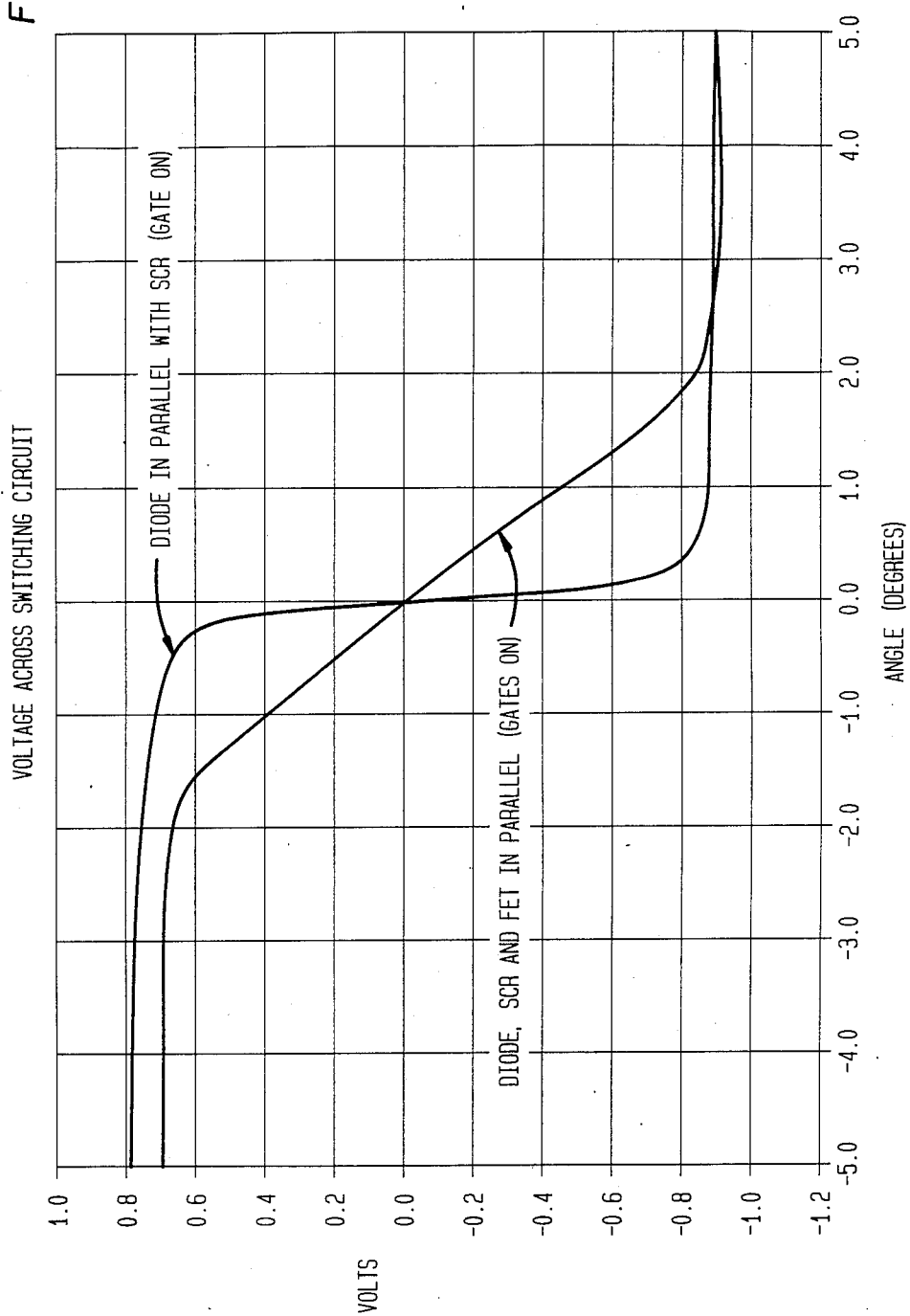
Figure 20B:
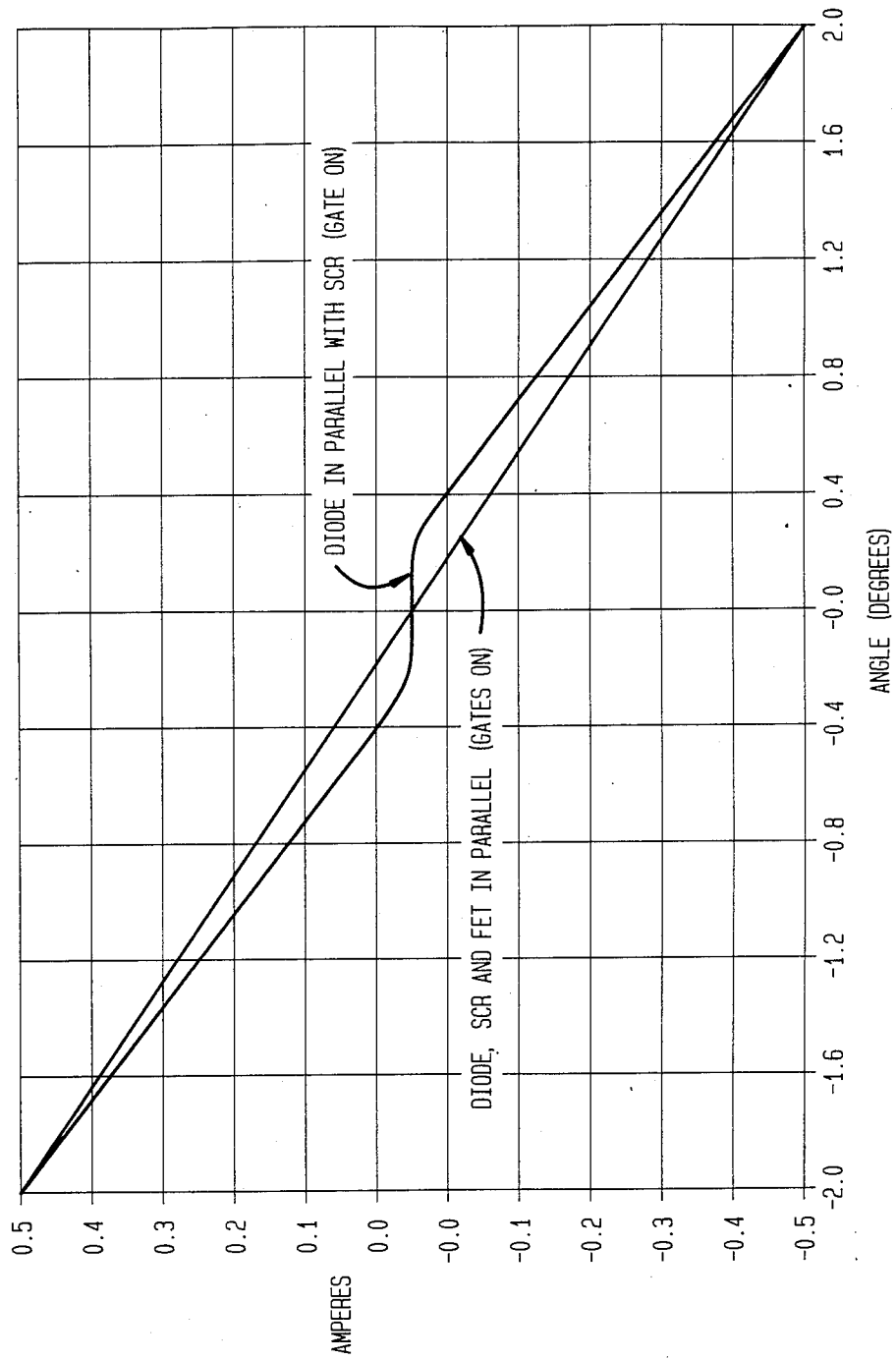

The net effect of the first preferred embodiment is illustrated in FIGS. 17, 17A and 17B. Without the FET 24, the power diode 22 and SCR 20 together differ substantially from an ideal pass element, because during the transition region, current flowing through the network does not smoothly follow the voltage across it. However, with the FET 24, the current smoothly follows the voltage.

At present, there are no FET's which can simultaneously handle large currents and block high voltages without burning out; this is why an FET cannot be substituted for, e.g., an SCR in a switching circuit. However, the operating limits of the FET 24 are not exceeded in the first preferred embodiment. This is because the current through the FET 24 is limited by the voltage across the FET 24 divided by its internal resistance, and this voltage is in turn limited by the maximum voltage drop across the SCR 20 and power diode 22 pass network. Since this latter figure is low (typically 1.5 volts or less), the FET 24 never burns out.

The power diode 22 behaves in the same way at the end of a positive half-cycle as it does at the beginning, and the SCR 20 (with its gate on) behaves in the same way at the beginning of a negative half-cycle as it does at the end. This is because, in each case, full conduction of the device takes place only after there is a sufficient voltage existing across the device, and full conduction of the device cannot be sustained unless that voltage is present. Thus, the reduction of conducted EMI at negative-going zero-crossovers corresponds to the reduction of conducted EMI at positive-going zero-crossovers. This is illustrated in FIGS. 18–20C.

Persons skilled in the art can design appropriate circuitry to actuate the gates of the SCR 20 and the FET 24, provided that the following rules are observed in addition to the normal design considerations which apply to construction of conventional zero-crossover switching circuits:

1. When the preferred embodiment is turned on, the gates of the SCR 20 and the FET 24 must remain on during both positive-going and negative-going transition regions. This is to protect the FET 24 and keep conducted EMI within acceptable limits; the gates of the SCR 20 and FET 24 may be off between transition regions.

2. When the preferred embodiment is to be turned on from an off state, the gates of the SCR 20 and FET 24 must be turned on before a negative-going zero-crossover. This is to keep conducted EMI within acceptable limits.

3. When the preferred embodiment is to be turned off from an on state, the gates of the SCR 20 and FET 24 should be turned off at a negative-going zero-crossover.

Figure 21:
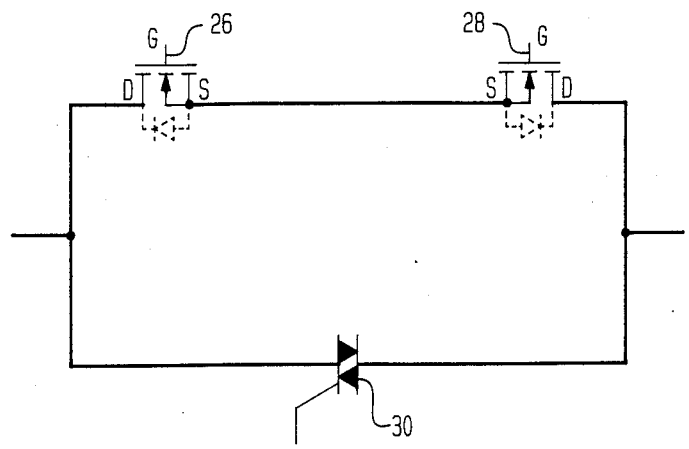
FIG. 21 is a schematic diagram of a second preferred embodiment.

A second preferred embodiment of the invention is illustrated in FIG. 21. Here, two like FET's 26 and 28 are placed back-to-back in series across a TRIAC 30 (or across two SCR's connected in inverse parallel, not shown). This circuit controls conduction in both the positive and negative half-cycle portions of the AC signal. In this embodiment, the gates of the FET's 26 and 28 are simultaneously energized in the transition region.

Figure 22:
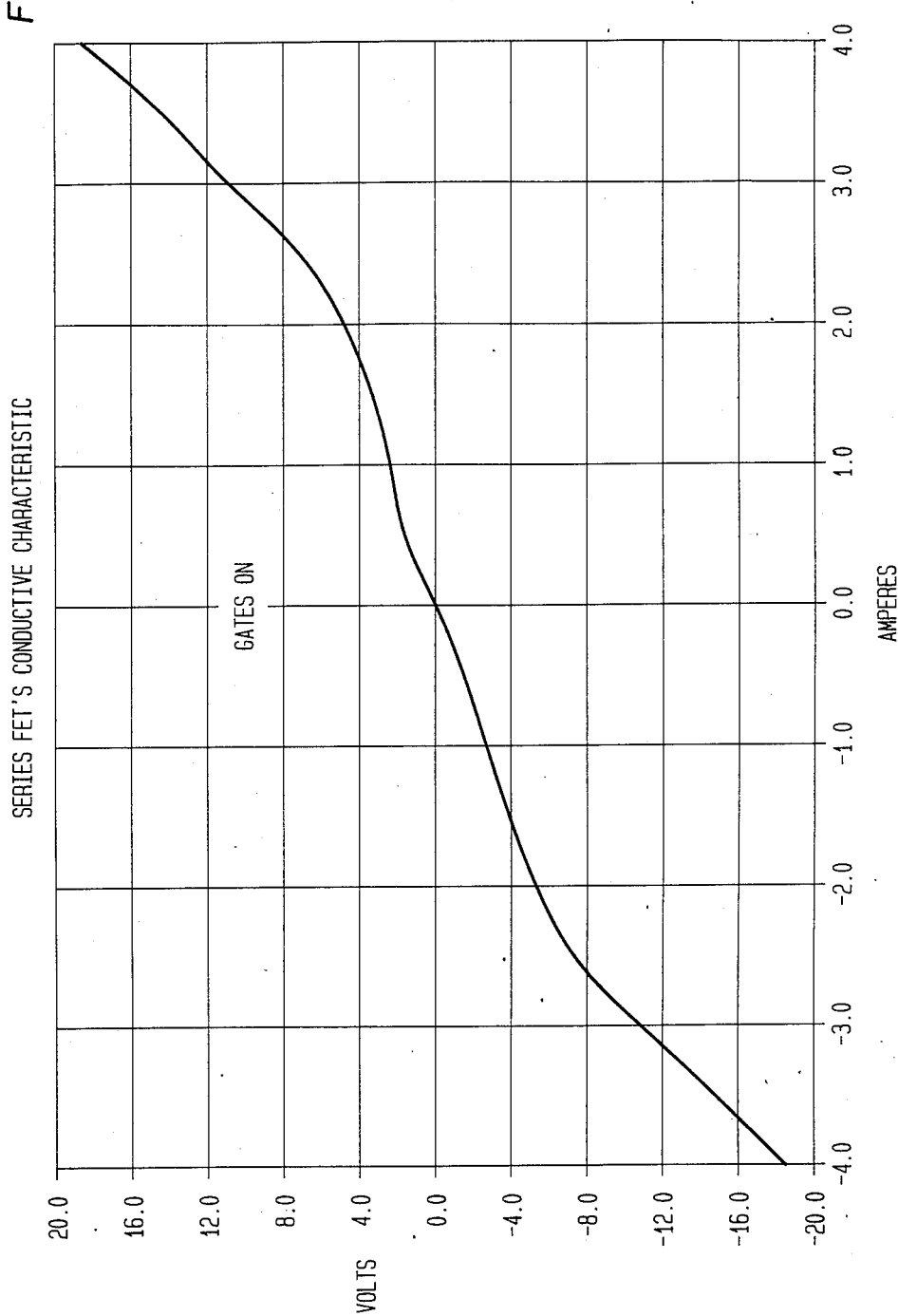
FIG. 22 is an illustration of the conduction characteristic of the bypass network used in the second preferred embodiment.

As shown in FIG. 22, the conduction characteristic of the series-connected FET's 26 and 28 is smooth in the transition regions about zero-crossover. This reduces conducted EMI when the gates of the FET's 26 and 28, on the one hand, and the gate of the TRIAC 30, on the other hand, are controlled in accordance with the first of the foregoing three considerations. Additionally, the FET's 26 and 28 must be turned on and turned off at zero-crossover. When two SCR's connected in inverse parallel are used instead of the TRIAC 30, the gates of the SCR's are turned on alternately.

One specific advantage of this second preferred embodiment is that it can be used to switch a single-phase AC load.

Although a preferred embodiment has been described above, the scope of the invention is limited only by the following claims

I claim:

1. An AC switching circuit with low conducted electromagnetic interference characteristics, comprising:
   a pass network including a switching element having a non-smooth conduction characteristic in a transition region about zero-crossover; and
   a bypass network connected in parallel with the pass network and having in said transition region a smooth conduction characteristic, the bypass network comprising a FET.

2. The circuit of claim 1, wherein the FET is of a type which includes a body diode between its source and drain.

3. The circuit of claim 1, wherein the pass network comprises an SCR.

4. The circuit of claim 3, wherein the SCR is connected in inverse parallel with a diode.

5. The circuit of claim 1, wherein the pass network comprises a TRIAC and the bypass network comprises two FET's connected back-to-back in series.

6. A half-wave switching circuit with low conducted electromagnetic interference characteristics, comprising:
   an SCR;
   a power diode connected in inverse parallel with the SCR; and
   an FET connected in parallel with the SCR and power diode in a manner that a body diode in the FET is connected in inverse parallel with the SCR.

7. A full-wave switching circuit with low conducted electromagnetic interference characteristics, comprising:
   a TRIAC; and
   two FET's connected back-to-back in parallel with the TRIAC.

* * * * *